(12) United States Patent
Nakajima et al.

(10) Patent No.: US 7,126,442 B2
(45) Date of Patent: Oct. 24, 2006

(54) PHASE SHIFTER

(75) Inventors: Kunihiko Nakajima, Haruna-Machi (JP); Kenichi Ohta, Haruna-Machi (JP); Yoshiki Iwazaki, Haruna-Machi (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 47 days.

(21) Appl. No.: 10/884,445

(22) Filed: Jul. 2, 2004

(65) Prior Publication Data
US 2005/0007213 A1 Jan. 13, 2005

(30) Foreign Application Priority Data
Jul. 8, 2003 (JP) ............... 2003-271772

(51) Int. Cl.
*H01P 1/18* (2006.01)
*H03H 7/18* (2006.01)

(52) U.S. Cl. ...................... 333/156; 333/138

(58) Field of Classification Search ............. 333/138, 333/139, 156; 327/261, 268, 270, 276, 283
See application file for complete search history.

(56) References Cited

U.S. PATENT DOCUMENTS

| | | | | |
|---|---|---|---|---|
| 1,968,237 A | * | 7/1934 | Weyers | 330/98 |
| 3,718,873 A | * | 2/1973 | Garver | 333/164 |
| 3,778,733 A | | 12/1973 | Rizzi | |
| 3,882,431 A | * | 5/1975 | Hopwood et al. | 333/139 |
| 4,630,010 A | * | 12/1986 | Yarman | 333/139 |
| 4,837,532 A | | 6/1989 | Lang | |
| 5,422,607 A | * | 6/1995 | McEwan | 333/20 |
| 5,471,220 A | * | 11/1995 | Hammers et al. | 342/372 |
| 5,519,349 A | * | 5/1996 | Nakahara | 327/237 |
| 5,734,349 A | * | 3/1998 | Lenormand et al. | 342/373 |
| 5,955,971 A | * | 9/1999 | Uemura | 340/947 |
| 6,020,795 A | * | 2/2000 | Kim | 333/33 |
| 6,320,480 B1 | | 11/2001 | Kintis et al. | |
| 6,603,367 B1 | * | 8/2003 | Pao et al. | 331/177 V |
| 6,683,513 B1 | * | 1/2004 | Shamsaifar et al. | 333/135 |
| 6,751,465 B1 | * | 6/2004 | Nakada | 455/512 |

FOREIGN PATENT DOCUMENTS

| | | |
|---|---|---|
| EP | 0 403 176 B1 | 4/1996 |
| EP | 0 732 808 B1 | 6/2003 |
| JP | 7-99424 | 4/1995 |
| JP | 11-168354 | 6/1999 |
| JP | 2000-315902 A | 11/2000 |
| JP | 2001-196804 A | 7/2001 |

OTHER PUBLICATIONS

Nancy E. Hodges and Michael H. Yam, "A Precise Analog Phase Shifter for SHF SATCOM Phased Arrays," GaAs IC Symposium pp. 29-32.

* cited by examiner

*Primary Examiner*—Robert Pascal
*Assistant Examiner*—Kimberly Glenn
(74) *Attorney, Agent, or Firm*—Knobbe Martens Olson & Bear LLP

(57) ABSTRACT

A phase shifter comprises: a phase shift unit including a reactance unit having a first variable capacitance device, and a susceptance unit having a second variable capacitance device, T-connected to the reactance unit; and a control unit for outputting a control signal continuously changing the capacitance of the first variable capacitance device and the second variable capacitance device to the phase shift unit. The amount of phase shift can be continuously changed by changing these variable capacitance devices continuously. Moreover, these devices can be formed on a semiconductor, thereby realizing low-voltage driving and high-speed response. Furthermore, the variance of impedance can be prevented by adjusting these two variable capacitance devices, whereby transmission efficiency can be improved.

11 Claims, 22 Drawing Sheets

Fig. 1
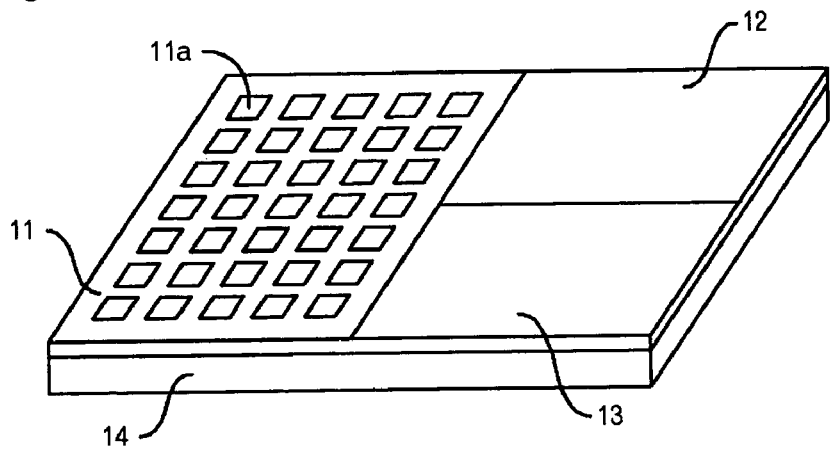
Fig. 2
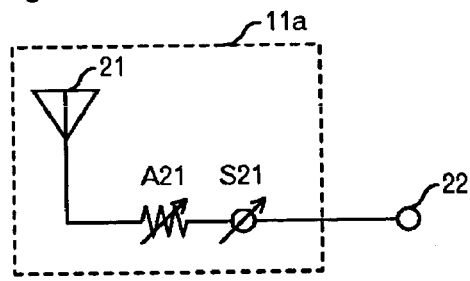
Fig. 3
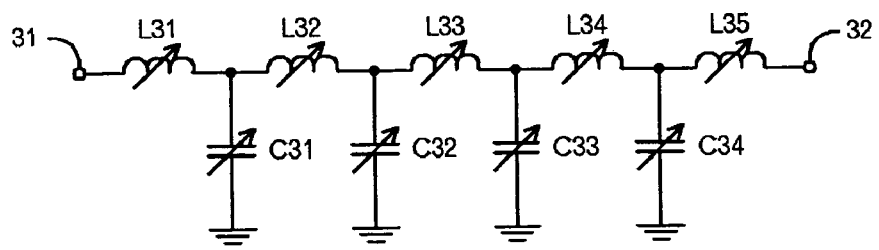
Fig. 4 (a)
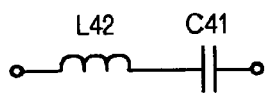
Fig. 4 (b)
Fig. 4 (c)
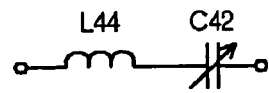
Fig. 4 (d)

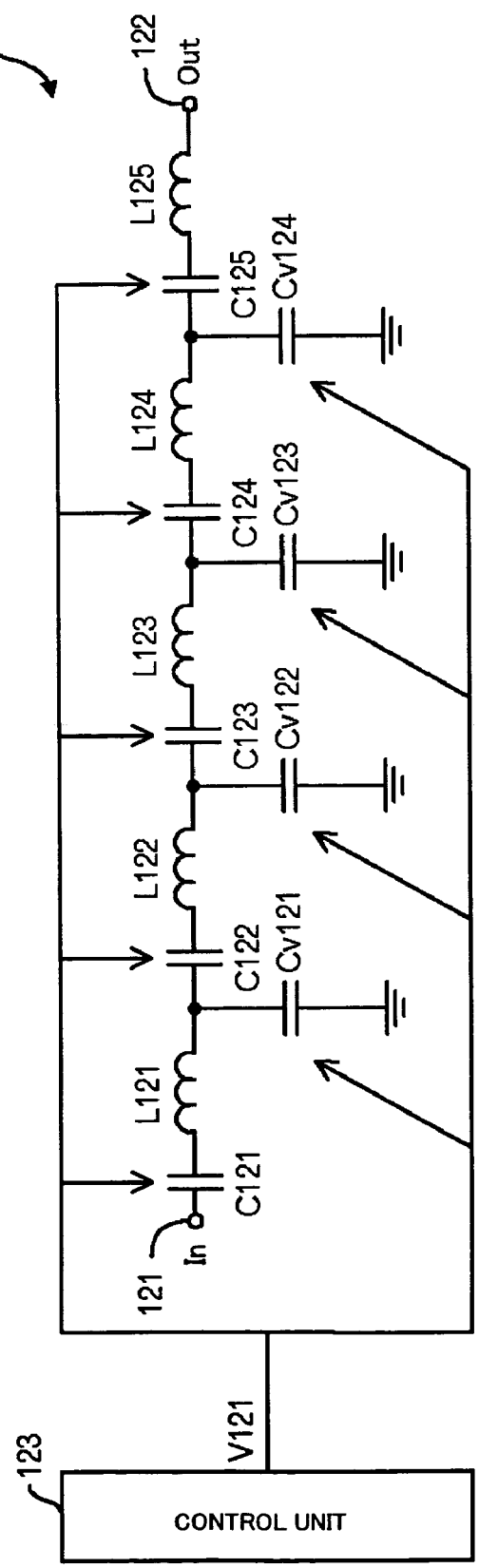

PHASE SHIFTER

This is a U.S. patent application claiming foreign priority under 35 U.S.C. § 119 to Japanese Patent Application No. 2003-271772, filed Jul. 8, 2003, the disclosure of which is herein incorporated by reference in their entirety.

BACKGROUND OF THE INVENTION

1. Field of the Invention

The present invention relates to a phase shifter.

2. Description of the Related Art

A phase shifter described below is disclosed in Japanese Unexamined Patent Application Publication No. 2001-196804, for example. That is to say, the phase shifter according to Japanese Unexamined Patent Application Publication No. 2001-196804 comprises an outer conductor, and two inner conductors stored inside of the outer conductor, wherein the two inner conductors comprise two fixed inner conductors connected to two terminals respectively, and a variable inner conductor having a configuration folded back in the shape of a U, which is slidably configured while securing high-frequency connection with the fixed inner conductor. However, the phase shifter according to Japanese Unexamined Patent Application Publication No. 2001-196804 mechanically changes impedance by sliding the fixed inner conductor, and accordingly providing a low-speed operation.

Also, with the first embodiment of Japanese Unexamined Patent Application Publication No. 7-99425, a phase shifter as shown in FIG. 27 is disclosed. The phase shifter 2000 shown in FIG. 27 includes an SPDT (Single Pole Double Throw) switch 2001, an LPF (Low Pass Filter) 2002 connected with the SPDT switch 2001 through a terminal 2006, an HPF (High Pass Filter) 2003 connected with the SPDT switch 2001 through a terminal 2007, an SPDT 2004 connected with the LPF 2002 through a terminal 2008, and the HPF 2003 through a terminal 2009, having an output terminal 2010.

The circuit diagram of the LPF 2002 included in the phase shifter 2000 is shown in FIG. 28. The LPF 2002 shown in FIG. 28 includes inductors L271 and L272, a capacitor C271, resistances R271 through R273, FETs (Field Effect Transistors) F271 through F273, and a gate bias terminal 2011. Note that the terminals 2006 and 2008 are the same as those shown in FIG. 27. The source of the FET F271 is connected to the terminal 2006, the drain thereof is connected to the inductor L271, and the gate thereof is connected to the gate bias terminal 2011 via the resistance R271. One end of the inductor L271 is connected to the drain of the FET F271, and the other end thereof is connected to the inductor L272 and the capacitor C271. One end of the inductor L272 is connected to the inductor L271 and the capacitor C271, and the other end thereof is connected to the source of the FET F272. One end of the capacitor C271 is connected to the inductor L271 and the inductor L272, and the other end thereof is connected to the source of the FET F273. The gate of the FET F273 is connected to the gate bias terminal 2011 via the resistance R273, and the drain thereof is grounded. The gate of the FET F272 is connected to the gate bias terminal 2011 via the resistance R272, and the drain thereof is connected to the terminal 2008.

First, description will be made regarding the operations of the LPF 2002, prior to description of the operations of the phase shifter 2000. The FETs F271 through F273 are controlled in common by the voltage of the gate bias terminal 2011. In other words, the FETs F271 through F273 are in either an all-on or an all-off state.

FIG. 29A illustrates an LPF 2002a which is an equivalent circuit of the LPF 2002 when the FETs F271 through F273 are all on. In a case that the FETs F271 through F273 are in an all-on state, ideally, the FETs F271 through F273 can be simplified with an equivalent circuit thereof. Accordingly, the LPF 2002a includes the inductors L271 and L272, and the capacitor C271. Here, the inductors L271 through L272 are serially connected between the terminal 2006 and the terminal 2008. Also, one end of the capacitor C271 is connected to a node between the inductors L271 and L272, and the other end thereof is grounded. Note that the inductors L271 and L272 and the capacitor C271 are the same as those shown in FIG. 28, and the terminals 2006 and 2008 are the same as those shown in FIG. 27. The reactance unit of the LPF 2002a comprises the inductors L271 and L272, and the susceptance unit comprises the capacitor C271 alone.

FIG. 29B illustrates the LPF 2002b which is an equivalent circuit of the LPF 2002 when the FETs F271 and F273 are all off. In a case that the FETs F271 through F273 are all off, it can be considered that the FETs are a capacitor having a specific capacity, and accordingly, the FETs are represented by a capacitor in the equivalent circuit. In FIG. 29B, the LPF 2002b includes inductors L271 and L272, the capacitor C271, and the capacitors F271a through F273a. Note that the inductors L271 and L272, and the capacitor C271 are the same as those shown in FIG. 28, the capacitors F271a through F273a correspond to the FETs F271 through F273 shown in FIG. 28, and the terminals 2006 and 2008 are the same as those shown in FIG. 27. Here, the capacitor F271a, the inductors L271 and L272, and the capacitor F272a are serially connected between the terminals 2006 and 2008, in that order. Also, one end of the capacitor C271 is connected to a node between the inductors L271 and L272, and the other end thereof is connected to the capacitor F273a. One end of the capacitor F273a is connected to the capacitor C271, and the other end thereof is grounded. The reactance unit of the LPF 2002b comprises the inductors L271 and L272, and the capacitors F271a and F272a, and the susceptance unit comprises the capacitor C271 and the capacitor F273a.

Next, the LPF 2002a shown in FIG. 29A will be compared with the LPF 2002b shown in FIG. 29B. The reactance unit of the LPF 2002b is configured by adding the capacitors F271a and F272a corresponding to the FETs F271 and F272 to the reactance unit of the LPF 2002a. The susceptance unit of the LPF 2002b is configured by adding the capacitor F273a corresponding to the FET F273 to the susceptance unit of the LPF 2002a. Thus, the standardization reactance between the LPFs 2002a and 2002b and the standardization susceptance between the LPFs 2002a and 2002b are both different. Two different amounts of phase shift of the LPF 2002 can be obtained by generating two different states wherein both the standardization reactance and the standardization susceptance are different by switching operations of the FETs. Though not shown in the drawing, FETs are included in the HPF 2003 shown in FIG. 27, two different amount of phase shift are obtained by switching operations of the FETs in the same way as with the LPF 2002. The amount of phase shift of the phase shifter 2000 is determined by the amount of phase shift of the LPF 2002 and the amount of phase shift of the HPF 2003, and different amounts of phase shift of the entire phase shifter 2000 can be obtained by switching operations of the FETs. For example, with the first embodiment in Japanese Unexamined Patent Application Publication No. 7-99425, description is made wherein a single phase shifter 2000 can realize switching of 45° and 90° by designing component devices such that the two amounts of phase shift obtained by the LPF 2002 are −67.5° and −22.5°, and the two amounts of phase shift obtained by the HPF 2003 are 22.5° and 67.5°. However, the amount of phase shift obtained by this phase shifter 2000 cannot be continuously changed due to discreteness thereof.

Moreover, with the second embodiment in Japanese Unexamined Patent Application Publication No. 7-99425, a phase shifter as shown in FIG. 30 is disclosed. The phase shifter 3000 shown in FIG. 30 includes the LPF 3001 and the HPF 3002 connected to an input terminal 3003 and an output terminal 3004. In other words, the LPF 3001 and the HPF 3002 are in parallel with each other.

The LPF 3001 includes inductors L291 and L292, and variable capacitance devices C291 through C293. The variable-capacity C291, the inductors L291 and L292, and the variable capacitance device C292 are serially connected between the input terminal 3003 and the output terminal 3004, in that order. Moreover, one end of the variable capacitance device C293 is connected to a node between the inductors L291 and L292, and the other end thereof is grounded.

The HPF 3002 includes the inductor L293, and the variable capacitance devices C294 through C296. The variable capacitance devices C294 and C295 are serially connected between the input terminal 3003 and the output terminal 3004, in that order. Moreover, one end of the inductor L293 is connected to a node between the variable capacitance devices C294 and C295, and the other end thereof is connected to the variable capacitance device C296. One end of the variable capacitance device C296 is connected to the inductor L293, and the other end thereof is grounded.

The principle of operations for the phase shifter 3000 shown in FIG. 30 will be described with reference to FIG. 31. In FIG. 31, wherein the amount of phase shift is represented by the central angle of a circle, and a signal component is represented by the vector extending in the circumferential direction from the center of the circle. In FIG. 31, a signal component 3010 represents a signal component passing through the LPF 3001 when the amount of passing phase shift of the LPF 3001 is −45°, and a signal component 3011 represents a signal component passing through the HPF 3002 when the amount of passing phase shift of the HPF 3002 is 45°. FIG. 31 illustrates that the amount of passing phase shift θ of the phase shifter 3000 can be obtained by vector synthesis of the signal component 3010 and the signal component 3011. That is to say, the amount of passing phase shift θ of the phase shifter 3000 is determined by changing the input/output impedance of the LPF 3001 and the HPF 3002 and performing vector synthesis without changing the amount of phase shift of the LPF 3001 and the HPF 3002. Note that the input/output impedance of the LPF 3001 and the HPF 3002 is adjusted so as to keep the input/output impedance of the phase shifter 3000 50 Ω. The desired amount of phase shift can be obtained in a specific range determined by the amount of phase shift of the LPF 3001 and the HPF 3002, and the signal components 3010 and 3011 using the above-described principal of operation. Detailed description will be made later.

Furthermore, Japanese Unexamined Patent Application Publication No. 11-168354, discloses a phase shifter as follows. That is to say, an arrangement has been made wherein in a case that an inductor or a capacitor is connected between the drain and the source of two FETs, and on voltage is applied to the gates of the FETs, the signal input from the drain of the FET is output from the source thereof without any change, on the other hand, in a case that a pinch-off voltage is applied to the gates of the FETs, the FETs go off, and the input signal passes through the inductor or the capacitor. The phase shifter disclosed in Japanese Unexamined Patent Application Publication No. 11-168354 changes 4 types of passing phase by combination of the on/off state of the two FETs. However, this change is a discrete change, and the amount of phase shift is not changed continuously.

Furthermore, with Japanese Unexamined Patent Application Publication No. 2000-315902, a phase shifter as follows is disclosed. That is to say, this phase shifter includes a conductor path for a high-frequency signal is formed on a first ceramic substrate, a metal film serving as a ground face formed on a second ceramic substrate, and a liquid crystal/resin complex comprising resin and liquid crystal scattered in this resin, which are disposed between both the substrates while the conductor path and the metal film facing each other. Though the phase shifter disclosed in Japanese Unexamined. Patent Application Publication No. 2000-315902 changes the dielectric constant of the liquid crystal/resin complex by control voltage so as to change the amount of phase shift, there is the difficulty that control voltage is high.

Furthermore, with U.S. Pat. No. 4,837,532, a phase shifter shown in FIG. 32 is disclosed. The phase shifter 4000 according to U.S. Pat. No. 4,837,532 has a configuration wherein multiple unit elements, each made up of a variable capacitance device with one end connected to a node of two inductors serially connected and the other end grounded, are serially connected. That is to say, as shown in FIG. 32, a section S-1 which is a unit element connected to an input terminal Q0, a section S-2 connected to the section S-1 through a node Q1, and so on through a section S-n connected to the section S-(n−1) (not shown) and an output terminal Qn, are included in the present phase shifter. With the first section S-1 which is a unit element, an inductor L1$a$ and an inductor L1$b$ are serially connected between the input terminal Q0 and the node Q1, one end of a variable capacitance device C1 is connected to a node of the inductors L1$a$ and L1$b$, and the other end the variable capacitance device C1 is grounded. In the same way, with the second section S-2 of which is a unit element, an inductor L2$a$ and an inductor L2$b$ are serially connected between the nodes Q1 and Q2, one end of a variable capacitance device C2 is connected to a node of the inductors L2$a$ and L2$b$, and the other end the variable capacitance device C2 is grounded. With the final section S-n which is a unit element, an inductor Lna and an inductor Lnb are serially connected between the node Q (n−1) (not shown) and the output terminal Qn, one end of a variable capacitance device Cn is connected to a node of the inductors Lna and Lnb, and the other end the variable capacitance device Cn is grounded. Note that the phase shifter 4000 further includes an bias inductor L311, and a bias capacitor C311, wherein the bias inductor L311 and the bias capacitor C311 are sequentially connected between the output terminal Qn and the ground, and the node between the bias inductor L311 and the bias capacitor C311 serves as a bias voltage input terminal 4003.

More specifically, inductances of respective inductors Lia and Lib (i is an integer 1 through n) are the same, and are each represented by L/2. The capacitance of each variable capacitance device Ci is equally adjusted, and is represented by C. At this time, characteristic impedance $Z_0$ is represented as the following expression. In other words, the characteristic impedance $Z_0$ is a function of capacitance C of the variable capacitance device Ci. However, the characteristic impedance varies since only the dominator within the root varies.

$$Z_0(C) = \sqrt{\frac{L}{C} - \omega^2 \frac{L^2}{4}} \quad (1)$$

Variance of the characteristic impedance causes impedance-mismatching, leading to a passing loss of the phase shifter due to reflection, and accordingly no variance is preferable. U.S. Pat. No. 4,837,532 discloses that in a case that the phase shifter is configured of a unit element of the first section alone, there is the need to change the capacitance of the variable capacitance device C1 greatly, so that the characteristic impedance varies widely, consequently increasing impedance-mismatching, however, employing multiple sections can reduce the adjustment level for capacitance of the variable capacitance device Ci in each unit element, thereby preventing impedance-mismatching. Ideally, the closer to infinity the number of sections is, the closer to zero the passing loss is, however, in reality, the number of sections is limited, and accordingly, a certain amount of passing loss remains. Thus, transmission efficiency deteriorates.

FIG. 1 illustrates an antenna application known to the Inventor. The example of the antenna application shown in FIG. 1 is a smart antenna comprising an array antenna block 11 formed on a semiconductor substrate 14, a millimeter wave circuit block 12, and a logical circuit block 13. The array antenna block 11 includes multiple antennas 11a. The configuration of each of the antennas 11a is shown in FIG. 2. With the antenna 11a, a receiving unit 21, an attenuator A21, and a phase shifter S21 are serially connected, in that order. An signal received by the receiving unit 21 is attenuated at the attenuator A21, the amount of phase shift thereof is adjusted by the phase shifter S21, and the adjusted signal is output to a signal synthesizing unit 22 within the millimeter wave circuit block 12 shown in FIG. 1. The signal synthesizing unit 22 synthesizes input signals of all the antennas on the array antenna block 11, and outputs the synthesized signal to an unshown demodulator within the millimeter wave circuit block 12, for example.

With the antenna application as shown in FIG. 1, though conditions such as low-voltage driving, continuous variation of phase shift, and high-speed variation of phase shift are required, none of the phase shifters disclosed in the above-described Japanese Unexamined Patent Application Publication Nos. 2001-196804, 7-99425, 11-168354, and 2000-315902 satisfy all these conditions. While the phase shifter 4000 according to U.S. Pat. No. 4,837,532 realizes all these conditions, transmission efficiency deteriorates due to the variance of the characteristic impedance accompanied with the above-described variance of the amount of phase shift.

SUMMARY OF THE INVENTION

Accordingly, in an embodiment, an object of the present invention is to provide a phase shifter for satisfying low-voltage driving, continuous variation of phase shift, and high-speed variation of phase shift, and also having excellent transmission efficiency.

Moreover, in an embodiment, another object of the present invention is to provide a phase shifter for satisfying low-voltage driving, continuous variation of phase shift, and high-speed variation of phase shift, and also having a new configuration for enabling impedance-matching.

A phase shifter according to a first aspect of the invention comprises a phase shift unit including a reactance unit including a first variable capacitance device, and a susceptance unit including a second variable capacitance device, T-connected to the reactance unit (the reactance unit, an adjacent reactance unit, and the susceptance unit form a T-section); and a control unit for outputting to the phase shift unit a control signal continuously changing the capacitance of the first variable capacitance device and the second variable capacitance device. The amount of phase shift can be continuously changed by changing the variable capacitance devices included in both the reactance unit and the susceptance unit continuously. Moreover, these devices can be formed on a semiconductor, thereby realizing low-voltage driving and high-speed response. Furthermore, the variance of impedance can be prevented by adjusting these two variable capacitance devices. Thus, transmission efficiency can be improved.

The above-described control unit further may output a control signal so as to satisfy a condition that maintains the following expression constant:

$$Z_0 = \sqrt{\frac{X}{B}}$$

wherein X represents the reactance of the reactance unit, and B represents the susceptance of the susceptance unit. Maintaining the impedance $Z_0$ at a constant allows passing loss to infinitely approximate zero.

The above-described control unit may control the first variable capacitance device and the second variable capacitance device simultaneously.

A phase shifter according to a second aspect of the invention comprises a phase shift unit including a reactance unit including a first variable capacitance device, and a susceptance unit including a second variable capacitance device, T-connected to the reactance unit; and a control unit for outputting a control signal to the phase shift unit, wherein a plurality of the phase shift units is serially connected. The amount of phase shift can be continuously changed by changing the variable capacitance devices included in both the reactance unit and the susceptance unit continuously. Moreover, these devices can be formed on a semiconductor, thereby realizing low-voltage driving and high-speed response. Furthermore, the variance of impedance can be prevented by adjusting these two variable capacitance devices. Thus, transmission efficiency can be improved. Furthermore, serially connecting a plurality of the phase shift units reduces the load for control of each phase shift unit.

The above-described control unit further may output a control signal so as to maintain the following expression constant:

$$Z_0 = \sqrt{\frac{X}{B}}$$

wherein X represents reactance for the reactance unit, and B represents susceptance for the susceptance unit.

The above-described control unit further may control the variable capacitance device and the second variable capacitance device simultaneously.

A phase shifter according to a third aspect of the invention comprises a phase shift unit including a reactance unit including a first variable capacitance device, and a susceptance unit including a second variable capacitance device, T-connected to the reactance unit; and a control unit for outputting a control signal to the phase shift unit, wherein the control unit outputs a first control signal for the first variable capacitance device, and a second control signal for the second variable capacitance device, which is independent of the first control signal. The amount of phase shift can be continuously changed by changing the variable capacitance devices included in both the reactance unit and the susceptance unit continuously. Moreover, these devices can be formed on a semiconductor, thereby realizing low-voltage driving and high-speed response. Furthermore, the variance of impedance can be prevented by adjusting these two variable capacitance devices using a first control signal and a second control signal. Thus, transmission efficiency can be improved.

The above-described control unit further may output a control signal so as to keep the following expression constant:

$$Z_0 = \sqrt{\frac{X}{B}}$$

where X represents reactance for the reactance unit, and B represents susceptance for the susceptance unit.

A phase shifter according to a fourth aspect of the invention comprises a phase shift unit including a reactance unit including a first variable capacitance device, and a susceptance unit including a second variable capacitance device, T-connected to the reactance unit; and a control unit for outputting a control signal to the phase shift unit, wherein the first variable capacitance device and the second variable capacitance device are made up with a predetermined capacity ratio, and the control signal is common to the first variable capacitance device and the second variable capacitance device. The amount of phase shift can be continuously changed by changing the variable capacitance devices included in both the reactance unit and the susceptance unit continuously. Moreover, these devices can be formed on a semiconductor, thereby realizing low-voltage driving and high-speed response. Furthermore, the common control signal can be applied to the first variable capacitance device and the second variable capacitance device by comprising the first variable capacitance device and the second variable capacitance device using a predetermined capacity ratio, thereby facilitating control of the entire phase shifter. Note that the variance of impedance can be prevented by adjusting these two variable capacitance devices using a control signal. Thus, transmission efficiency can be improved.

The above-described control unit further may output a control signal so as to keep the following expression constant:

$$Z_0 = \sqrt{\frac{X}{B}}$$

where X represents reactance for the reactance unit, and B represents susceptance for the susceptance unit. Furthermore, the above-described capacity-ratio may be determined by the area ratio of the first variable capacitance device and the second variable capacitance device.

Furthermore, with the phase shifters according to the first embodiment through the fourth embodiment of the present invention, the above-described control unit may control the first variable capacitance device and the second variable capacitance device to change the capacitance thereof in the same direction.

Moreover, with the phase shifters according to the first embodiment through the third embodiment of the present invention, the above-described control unit may output a control signal so as to satisfy a condition wherein in a case that the capacitance of the first variable capacitance device is increased, the capacitance of the second variable capacitance device is also increased. In some cases, impedance-matching may be enabled by performing such control.

Furthermore, with the phase shifters according to the first embodiment through the fourth embodiment of the present invention, the above-described control unit may output a control signal so as to satisfy a condition wherein in a case that the amount of passing phase shift of the phase shifter is increased, both the capacitance of the first variable capacitance device and the capacitance of the second variable capacitance device are also increased. In some cases, impedance-matching may be enabled by performing such control, thereby obtaining a desired amount of phase shift.

According to at least one aspect of the present invention, a phase shifter for satisfying low-voltage driving, continuous variation of phase shift, and high-speed variation of phase shift, and also having excellent transmission efficiency may be provided.

Moreover, according to another aspect of the present invention, a phase shifter for satisfying low-voltage driving, continuous variation of phase shift, and high-speed variation of phase shift, and also having a new configuration for enabling impedance-matching may be provided.

In all of the foregoing embodiments, any element used in an embodiment can interchangeably be used in another embodiment, and any combination of elements can be applied in these embodiments, unless it is not feasible.

For purposes of summarizing the invention and the advantages achieved over the related art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention.

FIG. 3 is a diagram illustrating a circuit for describing the idea of an embodiment of the present invention;

FIGS. 4A through 4D are diagrams illustrating a circuit for describing the idea of an embodiment of the present invention;

FIG. 12 is a diagram illustrating the configuration of a phase shifter according to a second embodiment of the present invention;

FIG. 13 is an explanatory diagram describing the control of a phase shifter according to the second embodiment of the present invention;

FIG. 14 is an explanatory diagram describing the design concept of a constant k according to the second embodiment of the present invention;

FIG. 15 is an explanatory diagram describing the design concept of the constant k according to the second embodiment of the present invention;

FIG. 25 is a diagram illustrating the configuration of a phase shifter (mounting example) according to a fifth embodiment of the present invention;

DESCRIPTION OF THE PREFERRED EMBODIMENTS

As explained above, the present invention can be accomplished in various ways including, but not limited to, the foregoing embodiments. The present invention will be explained in detail with reference to the drawings, but the present invention should not be limited thereto.

[General Idea of the Invention]

The general idea applicable to at least one embodiment of the present invention will be explained below. The phase shifter 4000 disclosed in U.S. Pat. No. 4,837,532 has a problem wherein changing the susceptance unit alone causes characteristic impedance to be changed. Thus, employing a variable device in the reactance unit as well as the susceptance unit will be studied here. This can be represented as the following Expression (2):

$$Z_0 = \sqrt{\frac{L}{C}} = const. \tag{2}$$

Here, L denotes reactance for the reactance unit, C denotes susceptance for the susceptance unit, and the arrows indicate variable devices. Thus, the capacitance of the variable capacitance device is manifested on the denominator within the root of the expression for determining the characteristic impedance $Z_0$, and the inductance of the variable inductance device is manifested on the numerator thereof, so thought will be given to keeping the characteristic impedance $Z_0$ to a constant value by adjusting the capacitance due to the variable capacitance device and the inductance due to the variable inductance device.

Figure 1:
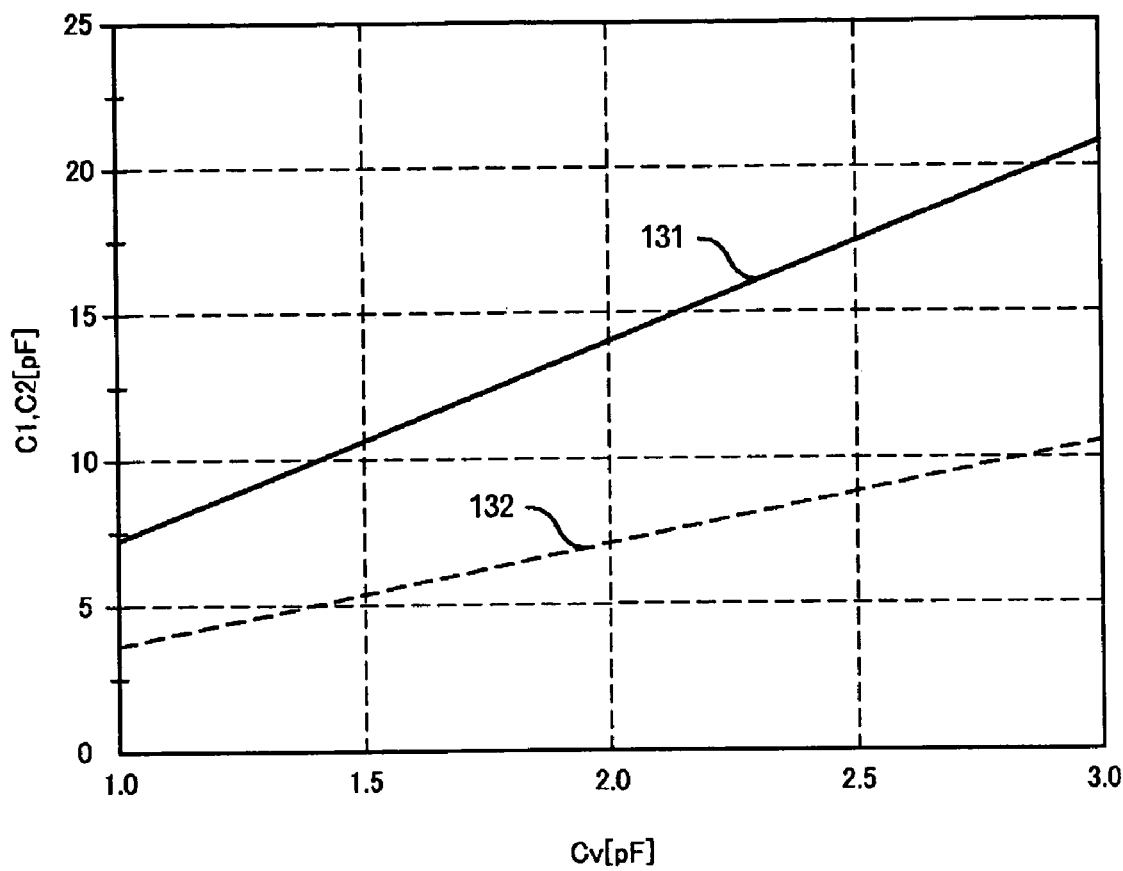
FIG. 1 is a diagram illustrating an example of an antenna application to which a phase shifter according to an embodiment of the present invention is mounted.
Figure 1:
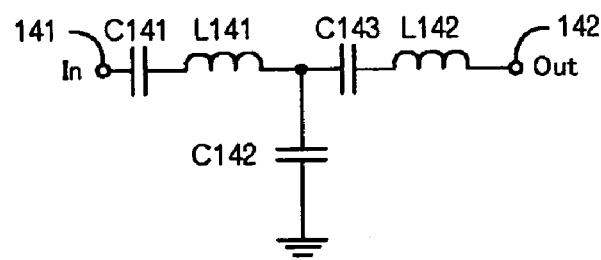
Figure 1:
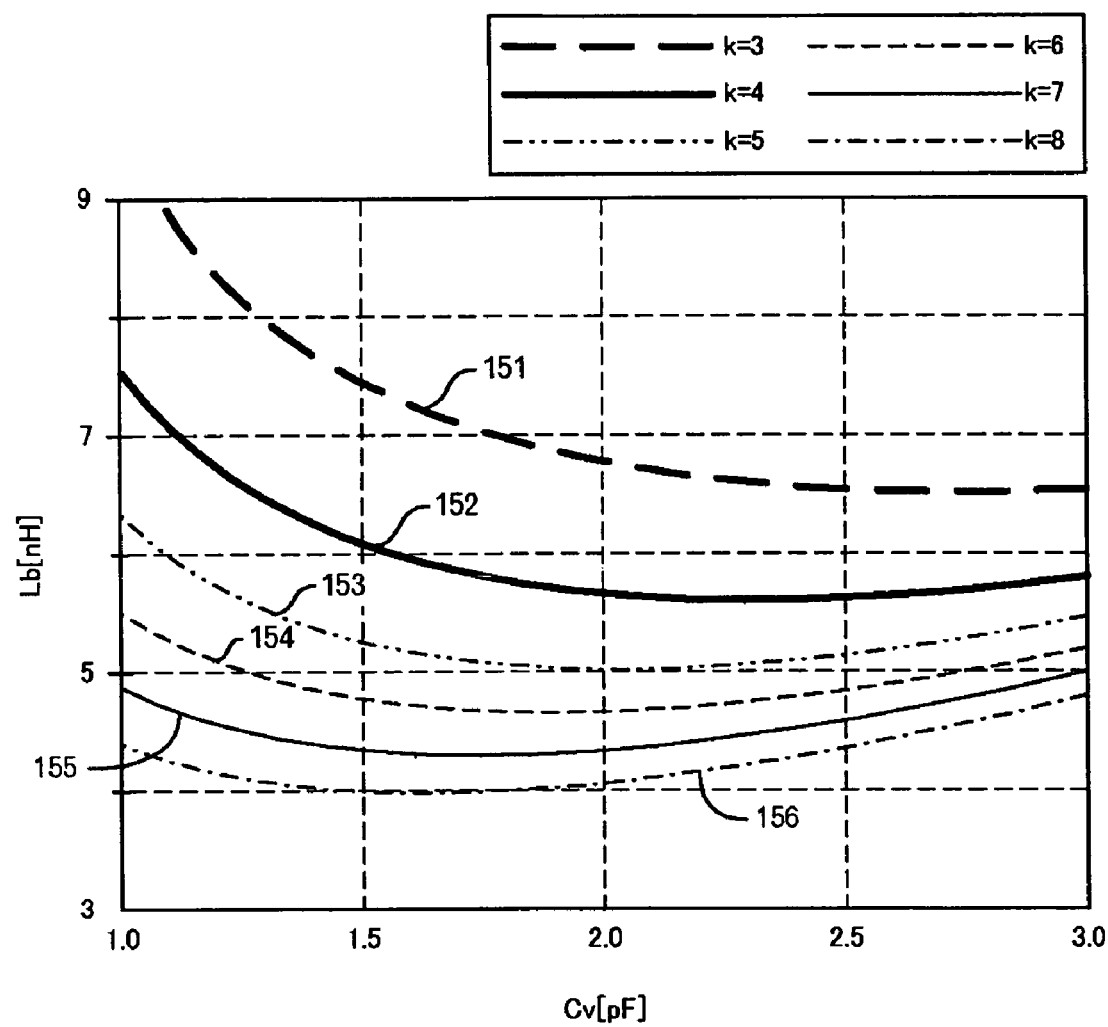

FIG. 3 illustrates a circuit diagram of the phase shifter based on the above-described concept. The phase shifter shown in FIG. 3 includes variable inductors L31 through L35 making up corresponding reactance units, and variable capacitors C31 through C34 making up corresponding susceptance units. The variable inductors L31, L32, L33, L34, and L35 are serially connected between an input terminal 31 and an output terminal 32, in that order. Moreover, one end of the variable capacitor C31 is connected to a node of the variable inductors L31 and L32, and the other end thereof is grounded. Furthermore, one end of the variable capacitor C32 is connected to a node of the variable inductors L32 and L33, and the other end thereof is grounded. Moreover, one end of the variable capacitor C33 is connected to a node of the variable inductors L33 and L34, and the other end thereof is grounded. Furthermore, one end of the variable capacitor C34 is connected to a node of the variable inductors L34 and L35, and the other end thereof is grounded. Note that while the number of sections (number corresponding to the number of susceptance units) of the phase shifter shown in FIG. 3 is four, this is only an example, and any number of sections may be employed. With the phase shifter shown in FIG. 3, there are variable devices in both the reactance units and the susceptance units, so that the amount of phase shift can be changed without changing the characteristic impedance by controlling the reactance units and the susceptance units so as to satisfy Expression (2). However, in reality, the variable inductors are made up only of devices required for mechanical operation, and accordingly, the antenna application shown in FIG. 1 cannot be employed.

Accordingly, with one or more embodiments of the present invention, the principle shown in FIGS. 4A through 4D is utilized. With FIGS. 4A through 4D, description will be made wherein a variable inductor can be substituted with an inductor of which inductance amount is fixed, and a variable capacitor. First, FIG. 4A illustrates an inductor L41. In a specific frequency, the inductor L41 in FIG. 4A may be represented with an equivalent circuit as shown in FIG. 4B. That is to say, in FIG. 4B, an inductor L42 and a capacitor C41 are serially connected, in that order.

FIG. 4C is obtained by substituting the inductor in FIG. 4A with a variable inductor. A variable inductor L43 is shown in FIG. 4C. As described in the relation in FIGS. 4A and 4B, in a specific frequency, the variable inductor L43 in FIG. 4C may be represented with an equivalent circuit as shown in FIG. 4D. That is to say, in FIG. 4D, an inductor L44 and a capacitor C42 are serially connected, in that order.

At this time, assuming that FIG. 4A is equivalent to FIG. 4B, the following Expression (3) is holds, on the other hand, assuming that FIG. 4C is equivalent to FIG. 4D, the following Expression (4) holds.

$$C41 = \frac{1}{\omega^2(L42 - L41)} \quad (3)$$

$$C42 = \frac{1}{\omega^2(L44 - L43)} \quad (4)$$

Here, C41 denotes the capacitance of the capacitor C41, C42 denotes the capacitance of the Capacitor C42, L41 denotes the inductance of the inductor L41, L42 denotes the inductance of the inductor L42, L43 denotes the inductance of the inductor L43, L44 denotes the inductance of the inductor L44, ω denotes an angle frequency in a specific frequency, and the arrows indicate the capacitance of the variable device or the inductance thereof.

Thus, a variable inductor can be substituted with a fixed inductor and a variable capacitor in a specific frequency. Utilizing this principle allows all devices to be formed on a semiconductor substrate, thereby enabling high-speed response and low-voltage driving, and also realizing impedance-matching. That is to say, transmission efficiency can be improved.

[General Concept of the Invention]

Next, the general concept of at least one embodiment of the present invention will be described based on the above-described general idea of the present invention.

Figure 5:
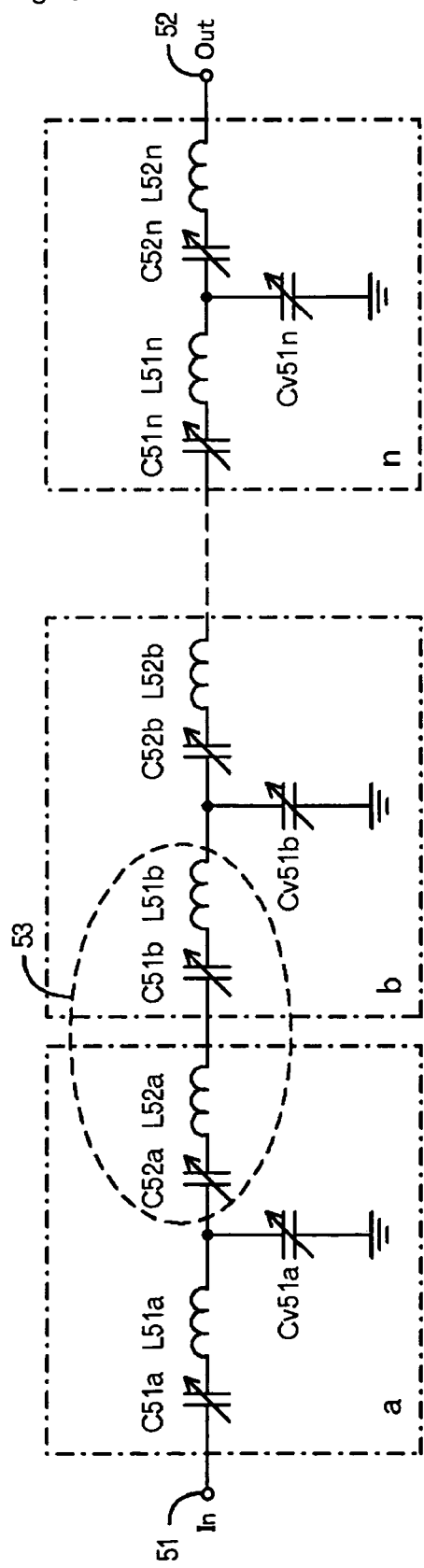
FIG. 5 is a diagram illustrating a circuit for describing the basic concept of an embodiment of the present invention.

FIG. 5 illustrates the circuit diagram of a phase shifter according to the general concept of an embodiment of the present invention. As shown in FIG. 5, the phase shifter according to this embodiment of the present invention is configured by serially connecting multiple unit elements. In other words, a unit element a, unit element b, and so on through and unit element n (n is a positive integer), each of which is surrounded by one-dash broken lines, are serially connected between an input terminal 51 and an output terminal 52, in that order. Moreover, the unit element "a" includes variable capacitors C51a, C52a, and Cv51a, and inductors L51a and L52a. Here, the variable capacitor C51a, the inductor L51a, the variable capacitor C52a, and the inductor L52a make up a reactance unit, which are serially connected between the input terminal 51 and the unit element b, in that order. Moreover, one end of the variable capacitor Cv51a is connected to a node of the inductor L51a and the variable capacitor C52a, and the other end thereof is grounded. The variable capacitor Cv51a makes up a susceptance unit. In the same way, the unit element b includes variable capacitors C51b, C52b, and Cv51b, inductors L51b and L52b. Here, the variable capacitor C51b, the inductor L51b, the variable capacitor C52b, and the inductor L52b make up a reactance unit, which are serially connected between the unit element a and an unshown unit element c, in that order. Moreover, one end of the variable capacitor Cv51b is connected to a node of the inductor L51b and the variable capacitor C52b, and the other end thereof is grounded. The variable capacitor Cv51b makes up a susceptance unit. Subsequently repeated in the same way, the unit element n includes variable capacitors C51n, C52n, and Cv51n, inductors L51n and L52n. Here, the variable capacitor C51n, the inductor L51n, the variable capacitor C52n, and the inductor L52n make up a reactance unit, which are serially connected between an unshown unit element (n−1) and the output terminal 52, in that order. Moreover, one end of the variable capacitor Cv51n is connected to a node of the inductor L51n and the variable capacitor C52n, and the other end thereof is grounded. The variable capacitor Cv51n makes up a susceptance unit.

In FIG. 5, the variable capacitors C51a, C52a, C51b, C52b, and so on through C51n, and C52n are all the same variable capacitance device, the variable ranges of the capacitance thereof are also the same. Also, the inductance of the inductors L51a, L52a, L51b, L52b, and so on through L51n, and L52n are also the same. Moreover, the variable capacitors Cv51a, Cv51b, and so on through Cv51 (n−1), and Cv51n are all the same variable capacitance device, the variable ranges of the capacitance thereof are also the same.

With the phase shifter such as shown in FIG. 5, the determination condition of the amount phase shift θ is represented as Expression (5), and the condition of impedance-matching is represented as Expression (6).

$$\theta = \tan^{-1} - \frac{B - 2X + BX^2}{2(1 - BX)} \quad (5)$$

-continued $$Z_0 = \sqrt{\frac{X}{B}} \quad (6)$$

wherein θ is the amount of phase shift, B is susceptance for a susceptance unit, X is reactance for a reactance unit, and $Z_0$ is impedance.

Note that X and B in Expressions (5) and (6) are represented as follows:

$$X = 2(j\omega L + 1/j\omega C)$$

$$B = \omega Cv$$

Note that L is the inductance of the inductors L51a, L52a, L51b, L52b, and so on through L51n, or L52n, C is the capacitance of the variable capacitors C51a, C52a, C51b, C52b, and so on through C51n, or C52n, Cv is the capacitance of the variable capacitors Cv51a, Cv51b, and so on through Cv51 (n-1), or Cv51n, and ω denotes an angle frequency.

With at least one embodiment of the present invention, B and X need to be changed so as to satisfy these two conditions. That is to say, there is the need to adjust C and Cv. Thus, impedance is matched, thereby improving transmission efficiency.

Now, let us give particular attention to a circuit 53 surrounded by dotted lines. In the circuit 53, the variable capacitor C52a, the inductor L52a, the variable capacitor C51b, and the inductor L51b are serially connected, in that order. Accordingly, with a real circuit, the variable capacitors C52a and C51b may be integrated as a variable capacitor which is equivalent to a circuit wherein the variable capacitors C52a and C51b are serially connected. In the same way, with a real circuit, the inductors L52a and L51b may be integrated as an inductor which is equivalent to a circuit wherein the inductors L52a and L51b are serially connected. Thus, the number of parts within the circuit can be reduced, thereby enabling the phase shifter to be manufactured with a reduced size and at a low cost. This reduction of the number of parts may be applied to other parts besides the circuit 53 straddling the unit element a and the unit element b. That is to say, this may be applied to the circuit straddling the unit element b and a unshown unit element c, and also to the circuit straddling an unshown unit element (n-1) and the unit element n.

Figure 6:
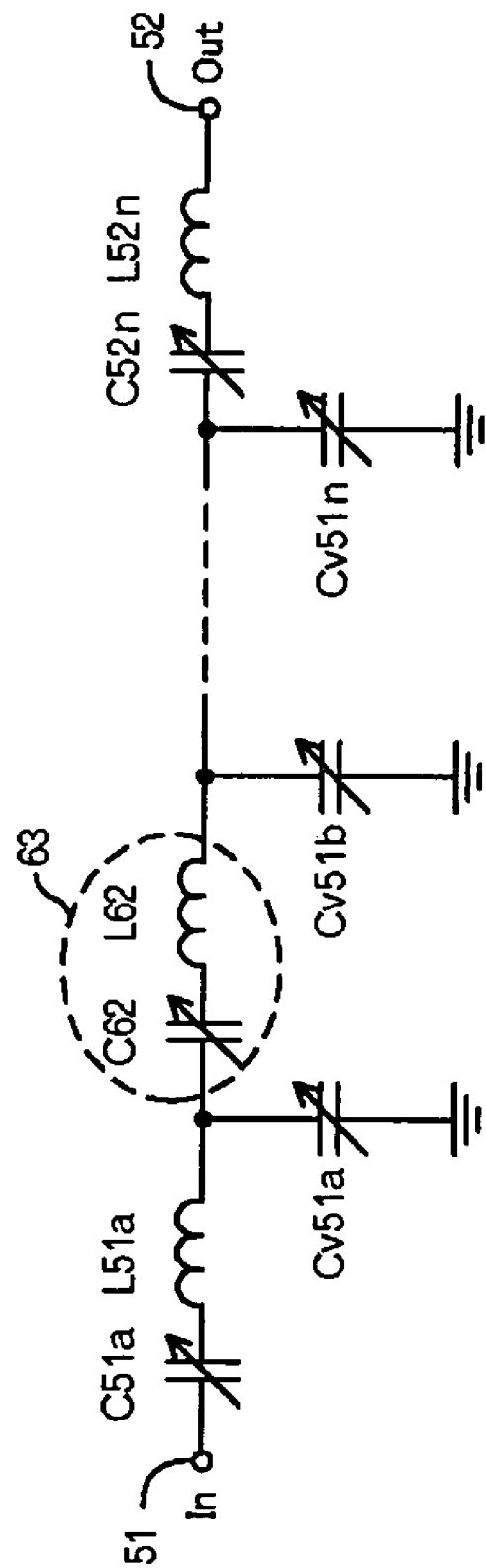
FIG. 6 is a diagram illustrating a circuit for describing the basic concept of an embodiment of the present invention.

FIG. 6 shows a circuit wherein the number of parts have been reduced as much as possible from the phase shifter shown in FIG. 5. The phase shifter shown in FIG. 5 and that in FIG. 6 are equivalent. The phase shifter shown in FIG. 6 includes variable capacitors C51a, C62, and so on through and C52n, variable capacitors Cv51a, Cv51b, and so on through and Cv51n, and inductors L51a, L62, and so on through and L52n. Note that the variable capacitors C51a and C52n, the variable capacitors Cv51a, Cv51b, and so on through and Cv51n, and the inductors L51a and L52n are the same as shown in FIG. 5. A circuit 63 shown in a dotted part is an equivalent circuit of the circuit 53 in FIG. 5. In the circuit 63, the variable capacitor C62 equivalent to a circuit wherein the variable capacitors C52a and C51b are serially connected, and the inductor L62 equivalent to a circuit wherein the inductors L52a and L51b are serially connected, are serially connected. A reactance unit made up of the variable capacitor C51a and the inductor L51a, and a susceptance unit made up of the variable capacitor Cv51a are T-connected. Further, a reactance unit made up of the variable capacitor C62 and the inductor L62, and a susceptance unit made up of the variable capacitor Cv51b are T-connected. Subsequently in the same way, reactance units and susceptance units are T-connected.

Note that with the phase shifter shown in FIG. 6, the following two expressions hold $$X = j\omega L + 1/(j\omega C)$$

$$B = \omega Cv$$

wherein X denotes reactance for a reactance unit, B denotes susceptance for a susceptance unit, ω denotes an angle frequency, L denotes the inductance of the inductor L62, C denotes the capacitance of the variable capacitor C62, and Cv denotes the capacitance of any one of the variable capacitors Cv51a through Cv51n.

Even with the phase shifter such as shown in FIG. 6, B and X need to be changed so as to satisfy the conditions represented by Expressions (5) and (6). That is to say, there is the need to adjust C and Cv. Thus, impedance is matched, thereby improving transmission efficiency.

[Difference as to Conventional Techniques]

There is a great difference between the phase shifters which have been described in the "Description of the Related Art" and the phase shifter according to at least one embodiment of the present invention regarding descriptions made in "General Idea of the Invention" and "General Concept of the Invention". However, a part of the circuits of some conventional phase shifters may be in common with those of the phase shifter according to at least one embodiment of the present invention. However, one skilled in the art could not combine the circuits of the conventional phase shiftersto lead to the general idea of the present invention. For example, a combination of the circuit of phase shifter according to the second embodiment of Japanese Unexamined Patent Application Publication No. 7-99425 and the circuit of the phase shifter of the phase shifter according to U.S. Pat. No. 4,837,532 could not be accomplished. There is absolutely no need to combine the circuits of these two phase shifters, rather, there is difficulty in combining these. Description will be made regarding the reason in detail.

Figure 30:
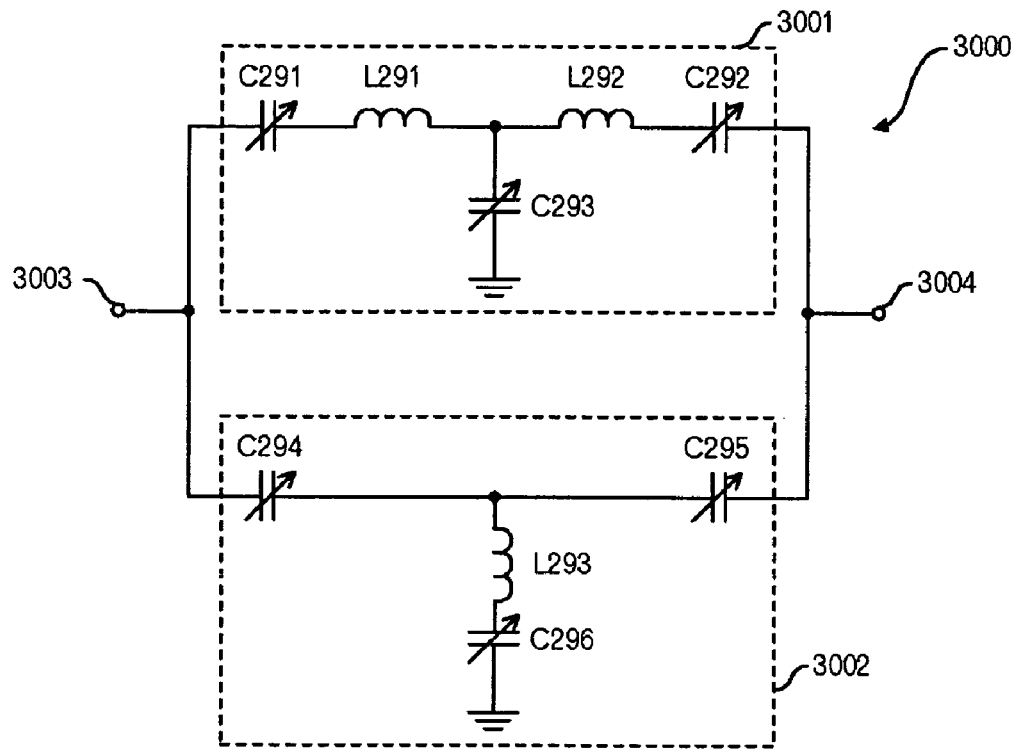
FIG. 30 is a diagram illustrating the configuration of a conventional phase shifter.
Figure 31:
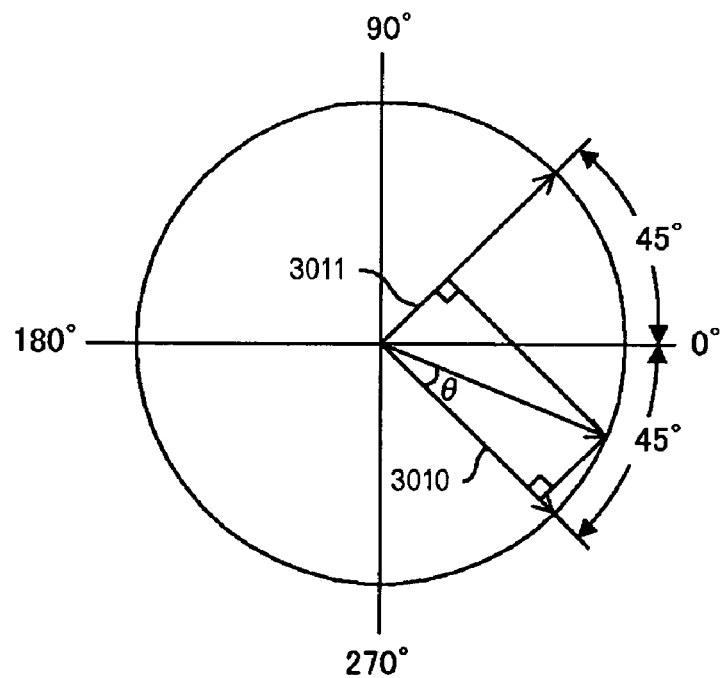
FIG. 31 is an explanatory diagram describing the principle of operation of a conventional phase shifter.

First, description will be made regarding the phase shifter disclosed in the second embodiment of Japanese Unexamined Patent Application Publication No. 7-99425 which is equivalent to the phase shifter according to an embodiment of the present invention in that variable capacitors are included in both the reactance unit and the susceptance unit. Note that with the phase shifter according to Japanese Unexamined Patent Application Publication No. 7-99425, the configuration and the principle of operation is the same as those described with reference to FIGS. 30 and 31, and accordingly, description will be made regarding the relation between the amount θ of phase shift of the phase shifter 3000 shown in FIG. 30 and control of variable capacitance devices within the phase shifter 3000.

The amount of passing phase shift θL of the LPF 3001 included in the phase shifter 3000 is fixed to -45° for example, and the amount of passing phase shift θH of the HPF 3002 is fixed to 45° for example, and accordingly, changing these dynamically has never been studied. Moreover, the impedance of the overall phase shifter 3000 is fixed to 50 Ω, for example. Subsequently, the amount of phase shift θ which is desired of the phase shifter 3000 is determined. Thus, the input/output impedance ZL of the LPF 3001 and the input/output impedance ZH of the HPF 3002 are obtained by the principle of operation shown in FIG. 31.

Furthermore, once ZL is determined, reactance XL for the reactance unit of the LPF 3001 and susceptance BL for the susceptance unit of the LPF 3001 are obtained. Once XL is determined, the capacitance of the variable capacitance device C291 and the variable capacitance device C292 is determined, on the other hand, once BL is determined, the capacitance of the variable capacitance device C293 is determined. With the HPF 3002 as with the LPF 3001, reactance XH for the reactance unit and susceptance BH for the susceptance unit are obtained. Once XH is determined, the capacitance of the variable capacitance device C294 and the variable capacitance device C295 is determined, on the other hand, once BH is determined, the capacitance of the variable capacitance device C296 is determined. The respective variable capacitance devices are controlled so as to obtain the desired amount θ of phase shift of the overall phase shifter 3000 as described above.

The features of this phase shifter 3000 are that:
(1) The amount of passing phase shift of the LPF 3001 and the HPF 3002 themselves is fixed, the amount of phase shift θ of the overall phase shifter 3000 is determined by the combination of the LPF 3001 and the HPF 3002; and
(2) The input/output impedance ZL of the LPF 3001 and the input/output impedance ZH of the HPF 3002 are adjusted to fix the impedance of the overall phase shifter 3000 to 50 Ω, for example.

Figure 32:
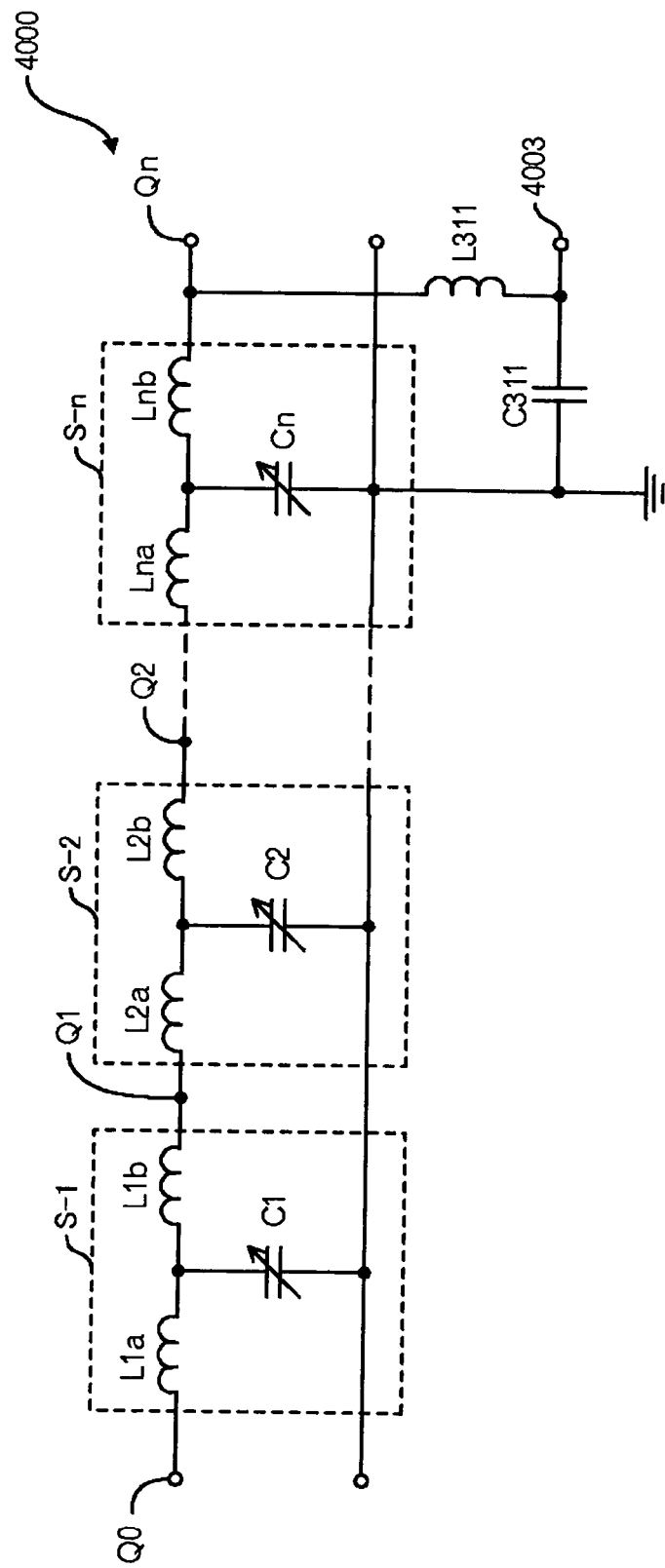
FIG. 32 is a diagram illustrating the configuration of a conventional phase shifter.

Next, study will be made regarding the phase shifter 4000 disclosed in U.S. Pat. No. 4,837,532. This phase shifter 4000 is common with the phase shifter according to an embodiment of the present invention in that the multiple unit elements including the reactance unit and the susceptance unit which are T-connected, are serially connected. Also, the phase shifter 4000 is common with the phase shifter according to an embodiment of the present invention in that the variable capacitor is included in the susceptance unit. However, though already described in "Description of the Related Art", the reactance unit does not include a variable capacitor, and accordingly causing impedance-mismatching in a sure manner. However, any solution has never been disclosed in that point. Note that the configuration and the principle of operation regarding the phase shifter 4000 are the same as those shown in the description of FIG. 32 and Expression (1).

Now, let us study problems in a case wherein the LPF 3001 of the phase shifter 3000 disclosed in the second embodiment of Japanese Unexamined Patent Application Publication No. 7-99425 having the common parts as with the phase shifter according to an embodiment of the present invention, is applied to the phase shifter 4000 disclosed in U.S. Pat. No. 4,837,532 having the common parts as with the phase shifter according to an embodiment of the present invention. That is to say, it would appear as if the configuration of the phase shifter in FIG. 5 described in "General Concept of the Invention" had been derived by extracting the LPF 3001 alone from the phase shifter 3000, and then serially connecting the multiple LPF 3001s such as in the configuration of the phase shifter 4000. However, an argument regarding the above-described combination needs to be substantiated by indicating motivation as to the combination in documents and techniques, and accordingly, any such argument regarding combination such as described above should be denied on the following grounds.

First of all, it is unreasonable to base argument on extracting the LPF 3001 alone of the phase shifter 3000 according to Japanese Unexamined Patent Application Publication No. 7-99425. The phase shifter 3000 works correctly only in the combination of the LPF 3001 and the HPF 3002. As described above, the amount of phase shift is fixed in a case of using the LPF 3001 alone, and accordingly, the impedance of the LPF 3001 must be changed so as to fix the impedance of the overall phase shifter. Consequently, both the capacitance of the reactance unit and the susceptance unit has to be changed in a discrete manner. Thus, employing the LPF 3001 alone generates a circuit only partway effective as a phase shifter, and the idea of focusing on and employing this alone is in itself unrealistic.

Second, there is a conceptual gap regarding impedance-matching. That is to say, with regard to the phase shifter 4000 according to U.S. Pat. No. 4,837,532, though there has been indication that there is a problem regarding impedance-matching, no solution has been provided yet. Moreover, with regard to the LPF 3001 of the phase shifter 3000 according to the second embodiment of Japanese Unexamined Patent Application Publication No. 7-99425 which is the object of argument here, impedance-matching is not taken into consideration at all. Thus, impedance-matching, which is the most important idea and issue in at least one embodiment of the present invention, has not been an issue to be solved in the conventional technique supposedly making up part of the combination. Accordingly, solution for the issue such as impedance-matching cannot be expected even if this combination is employed, so that there is no motivation for employing this combination from the perspective of impedance-matching.

Third, the design concept for reactance of the reactance unit and that for susceptance of the susceptance unit are completely different. As described above, the phase shifter 4000 according to U.S. Pat. No. 4,837,532 changes the capacitance of the variable capacitor to realize continuous change of phase shift, on the other hand, the LPF 3001 of the phase shifter 3000 according to Japanese Unexamined Patent Application Publication No. 7-99425 changes the capacitance of the variable capacitor such that the impedance is changed while fixing the amount of phase shift, and accordingly, the variable capacitors are adjusted under a completely different design concept. It is technically difficult to combine arrangements having such a different configuration.

Fourth, the amount of phase shift caused at the time of changing reactance for the reactance unit and susception for the susceptance unit is different. As can be understood from the above description, the amount of phase shift is fixed in the LPF 3001 of the phase shifter 3000 according to Japanese Unexamined Patent Application Publication No. 7-99425, on the other hand, the amount of phase shift is continuously changed in the phase shifter 4000 according to U.S. Pat. No. 4,837,532. Thus, advantages are completely different.

As described above, there is no reasonable motivation to apply the LPF 3001 of the phase shifter 3000 of which assumption, issues, configuration, and advantages, are completely different, to the phase shifter 4000, and such a combination is in itself difficult. Moreover, even if there were a part to be combined easily, it is not apparent how to change the capacitance of the variable capacitor.

[First Embodiment]

Figure 7:
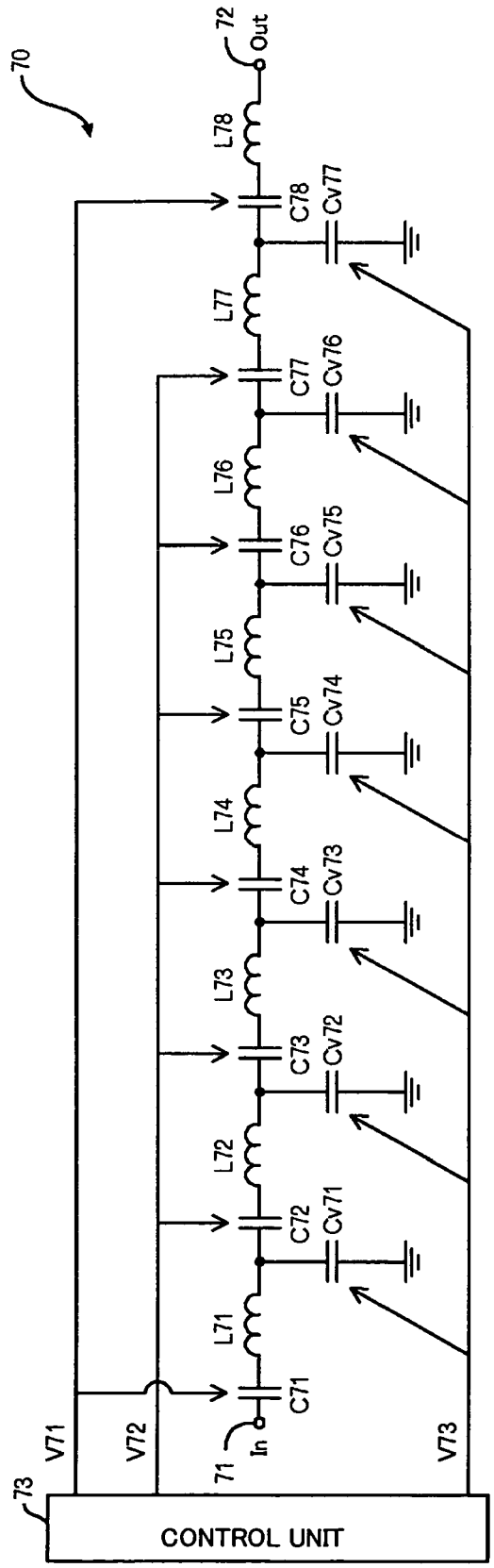
FIG. 7 is a diagram illustrating the configuration of a phase shifter according to a first embodiment of the present invention.

The configuration of a phase shifter according to a first embodiment of the present invention will be shown in FIG. 7. As shown in FIG. 7, a phase shifter 70 according to the first embodiment comprises a phase shift unit including variable capacitors C71 through C78, variable capacitors Cv71 through Cv77, and inductors L71 through L78, and a control unit 73. Note that the phase shifter according to the present embodiment includes no capacitors with fixed capacity, so simplified notation with a capacitor mark is employed for all of the variable capacitors. The variable capacitor C71, inductor L71, variable capacitor C72, inductor L72, variable capacitor C73, inductor L73, variable capacitor C74, inductor L74, variable capacitor C75, inductor L75, variable capacitor C76, inductor L76, variable capacitor C77, inductor L77, variable capacitor C78, and inductor L78 are serially connected between an input terminal 71 and output terminal 72, in that order. Moreover, one end of the variable capacitor Cv71 is connected to a node between the inductor L71 and variable capacitor C72, and the other end thereof is grounded. Furthermore, one end of the variable capacitor Cv72 is connected to a node between the inductor L72 and variable capacitor C73, and the other end thereof is grounded. Moreover, one end of the variable capacitor Cv73 is connected to a node between the inductor L73 and variable capacitor C74, and the other end thereof is grounded. Furthermore, one end of the variable capacitor Cv74 is connected to a node between the inductor L74 and variable capacitor C75, and the other end thereof is grounded. Moreover, one end of the variable capacitor Cv75 is connected to a node between the inductor L75 and variable capacitor C76, and the other end thereof is grounded. Furthermore, one end of the variable capacitor Cv76 is connected to a node between the inductor L76 and variable capacitor C77, and the other end thereof is grounded. Moreover, one end of the variable capacitor Cv77 is connected to a node between the inductor L77 and variable capacitor C78, and the other end thereof is grounded.

A pair of the variable capacitor C71 and inductor L71, a pair of the variable capacitor C72 and inductor L72, a pair of the variable capacitor C73 and inductor L73, a pair of the variable capacitor C74 and inductor L74, a pair of the variable capacitor C75 and inductor L75, a pair of the variable capacitor C76 and inductor L76, a pair of the variable capacitor C77 and inductor L77, and a pair of the variable capacitor C78 and inductor L78 each make up a reactance unit. Moreover, the capacitors Cv71 through Cv77 each make up a susceptance unit. One reactance unit is serially connected with one susceptance unit.

The variable capacitors C71 and C78 are the same variable capacitance device, and the variable range of capacitance thereof (hereafter, this is represented as C1 in the present embodiment) is also the same. In the same way, The variable capacitors C72 through C77 are the same variable capacitance device, and the variable range of capacitance thereof (hereafter, this is represented as C2 in the present embodiment) is also the same. The variable capacitors Cv71 through Cv77 are the same variable capacitance device, and the variable range of capacitance thereof (hereafter, this is represented as Cv in the present embodiment) is also the same.

Also, the arrow extending from the control unit 73 represents a control signal line for transmitting a control signal to each variable capacitor. More specifically, a control signal line V71 is a signal line for transmitting the control signal V71 to the variable capacitors C71 and C78, a control signal line V72 is a signal line for transmitting the control signal V72 to the variable capacitors C72 through C77, a control signal line V73 is a signal line for transmitting the control signal V73 to the variable capacitors Cv71 through Cv77. That is to say, an arrangement has been made wherein the common control signal is used as to the same variable capacitance device. However, with the present embodiment, an arrangement has been made wherein the control unit 73 outputs an independent control signal to each of the control signal lines V71 through V73.

The circuit constant of each device in the phase shifter 70 according to the present embodiment, in a case that the use conditions for the phase shifter 70 are input/output impedance of 50 Ω and also a frequency of 1 GHz, is as follows.

C1=5.96 through 14.47 [pF],
C2=3.62 to 12.67 [pF],
Cv=1.0 through 3.0 [pF],
L1=5.5 [nH], and
L2=9.5 [nH].

Here, L1 represents inductance for the inductors L71 and L78, and L2 represents inductance for the inductors L72 through L77. In a case of realizing the specific amount of phase shift θ, the specific value within a variable region is determined such that Expression (6) is satisfied, i.e., impedance is matched.

Figure 8:
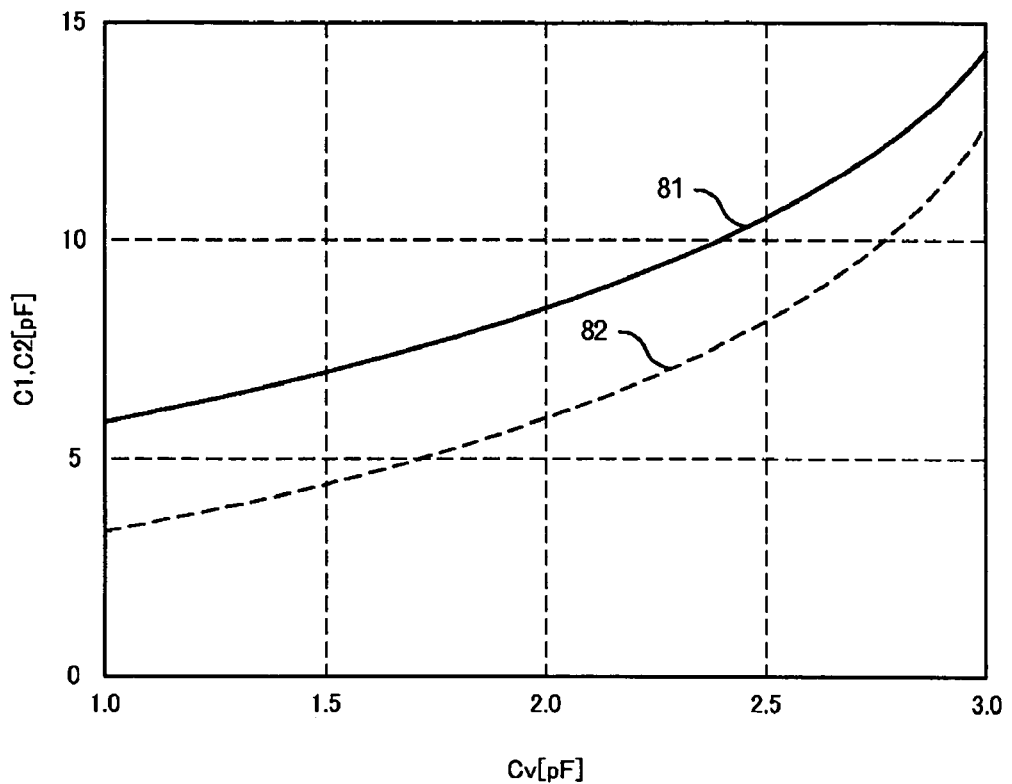
FIG. 8 is an explanatory diagram describing the control of a phase shifter according to the first embodiment of the present invention.

FIG. 8 illustrates a graph indicating the relation between Cv, C1, and C2 satisfying Expression (6). In FIG. 8, the vertical axis represents C1 and C2 [pF], and the horizontal axis represents Cv [pF]. The curve 81 shown in a solid line represents the change of C1 when Cv changes from 1.0 to 3.0 [pF] by the control signal V73, and the curve 82 shown in a dotted line represents the change of C2 when Cv changes from 1.0 to 3.0 [pF] by the control signal V73 in the same way. Note that as described above, C1 represents the change of C1 by the control signal V71, and C2 represents the change of C2 by the control signal V72. In this graph, in order to obtain a set of capacitance satisfying Expression (6), first, the value of Cv is determined. Next, the value of C1 is determined by the value of the vertical axis corresponding to the intersection between the line parallel to the vertical axis passing through the specific value of Cv, and the curve 81 representing the change of C1. In the same way, the value of C2 is determined by the value of the vertical axis corresponding to the intersection between the line parallel to the vertical axis passing through the specific value of Cv, and the curve 82 representing the change of C2 on the graph. In FIG. 8, for example, when determination is made that Cv=2.0 [pF], C1 and C2 are determined that C1=around 8 [pF], and C2=around 6 [pF]. Thus, a set of capacitance of C1, C2, and Cv that satisfies Expression (6) is obtained. Note that according to the graph in FIG. 8, both the curves 81 and 82 are right-increasing, and in a case of outputting the control signal V73 such as increasing Cv, the control unit 73 outputs the control signals V71 and V72 such as increasing C1 and C2.

Figure 9:
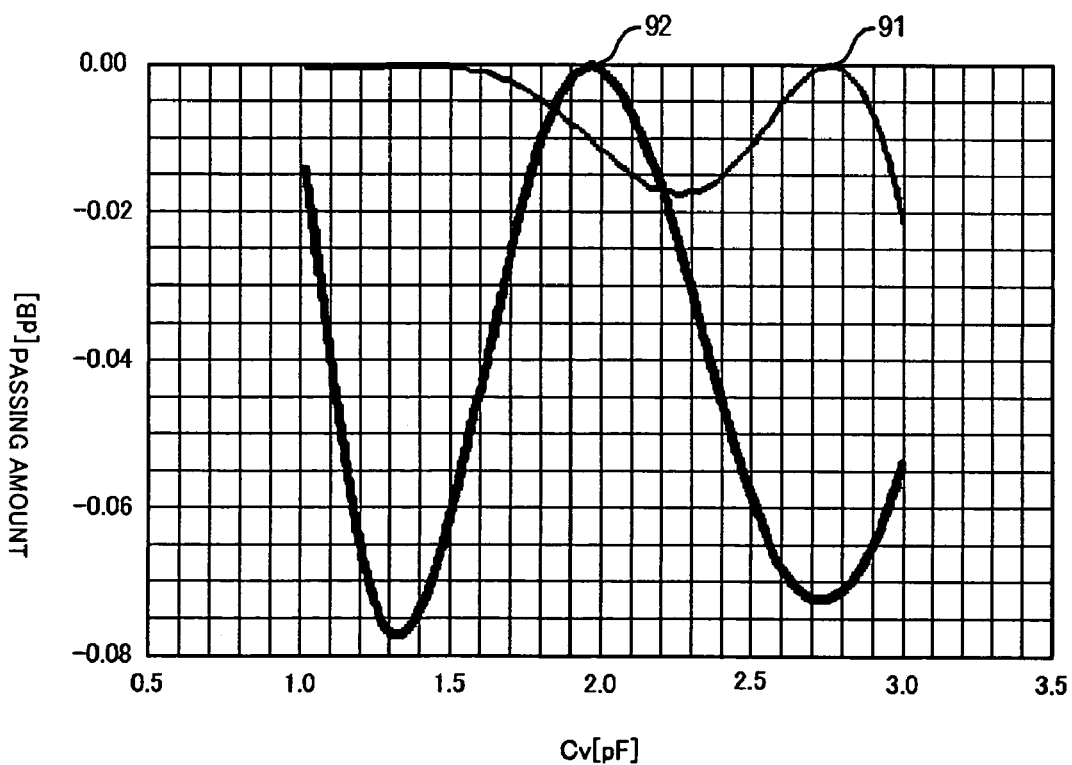
FIG. 9 is a diagram illustrating the passing amount of a conventional phase shifter and the passing amount of a phase shifter according to the first embodiment of the present invention.
Figure 10:
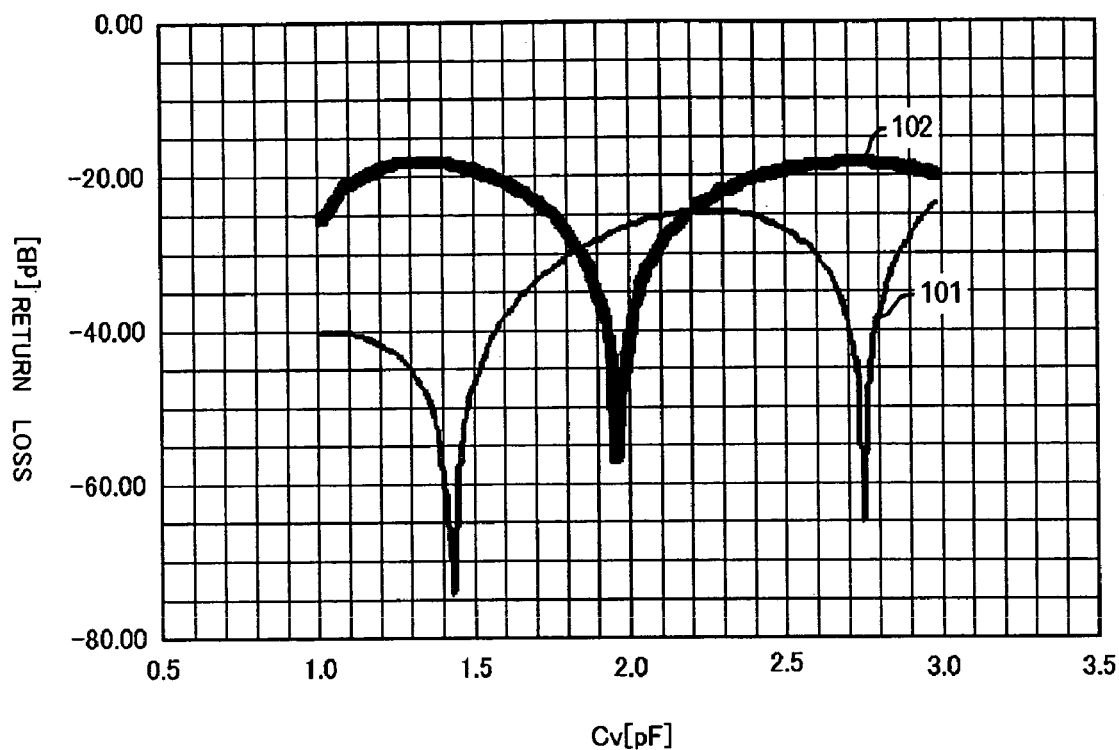
FIG. 10 is a diagram illustrating the return loss of a conventional phase shifter and a phase shifter according to the first embodiment of the present invention.
Figure 11:
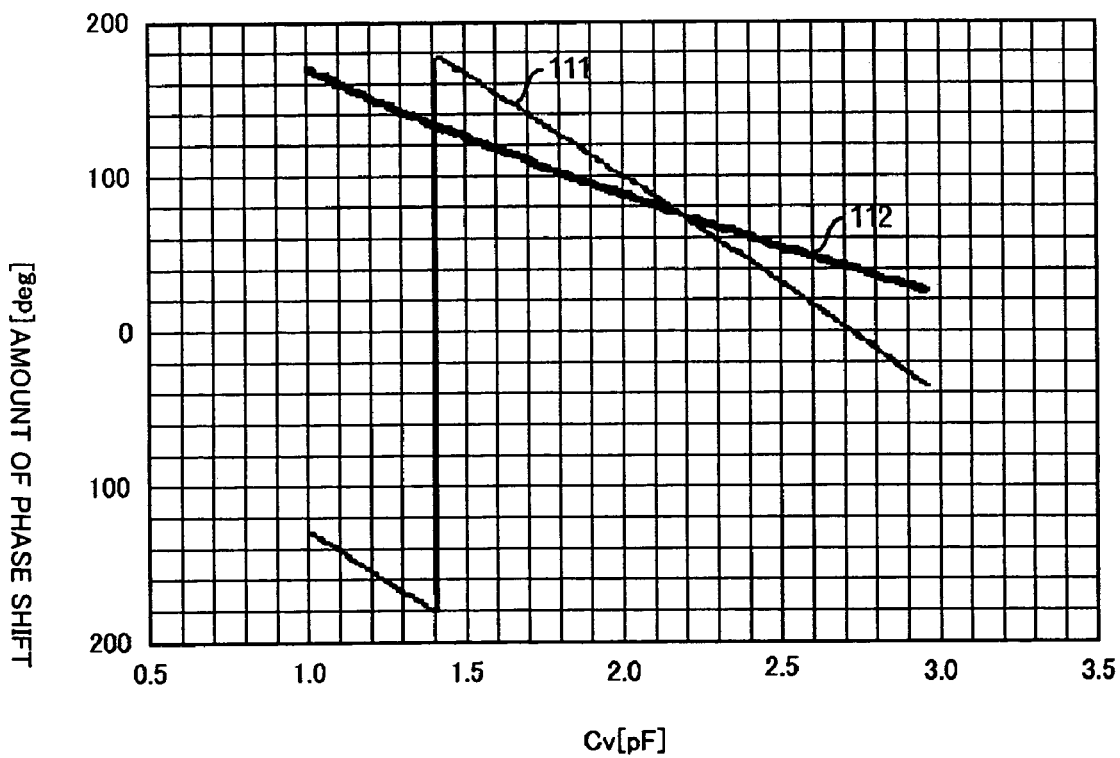
FIG. 11 is a diagram illustrating the phase shift properties of a conventional phase shifter and a phase shifter according to the first embodiment of the present invention.

Next, the properties of the phase shifter 70 according to the present embodiment will be compared with the properties of a conventional phase shifter with reference to FIGS. 9 through 11. The conventional phase shifter described here is a phase shifter equivalent to the phase shifter 70 shown in FIG. 7 of which the variable capacitors C71 through C78 are removed. In other words, the phase shifter is a phase shifter wherein only the susceptance units include a variable capacitor, such as the phase shifter disclosed in U.S. Pat. No. 4,837,532.

FIG. 9 illustrates a graph comparing passing amount. In FIG. 9, the vertical axis represents passing amount [dB], and the horizontal axis represents Cv [pF]. Also, the solid line 91 represents the passing amount of the phase shifter 70, and the heavy line 92 represents the passing amount of the conventional phase shifter. With the conventional phase shifter, the passing amount indicates a small value such as around −0.077 [dB] at around 1.3 [pF], and around −0.072 [dB] at around 2.7 [pF], exhibiting a curve similar to a sine curve. On the other hand, with the phase shifter 70, the passing amount indicates an appropriate value such as around −0.017 [dB] at around 2.25 [pF], and around −0.02 [dB] at around 3.0 [pF]. In particular, the passing amount indicates 0 [dB] at 1.0 to 1.5 [pF]. While the conventional phase shifter indicates a more appropriate value at around 1.85 to 2.2 [pF] than the phase shifter 70, the phase shifter 70 clearly indicates a more appropriate value than the conventional phase shifter as a whole. This is owing to the advantage of impedance-matching using Expression (6).

FIG. 10 is a graph comparing return loss. In FIG. 10, the vertical axis represents return loss [dB], and the horizontal axis represents Cv [pF]. Also, the solid line 101 represents the return loss of the phase shifter 70, and the heavy line 102 represents the return loss of the conventional phase shifter. With the conventional phase shifter, the maximum return loss is around −17.5 [dB] at around 1.32 [pF]. On the other hand, with the phase shifter 70, the maximum return loss is around −23 [dB] at around 3.0 [pF]. In other words, the maximum return loss of the phase shifter 70 indicates small as compared with that of the conventional phase shifter. While the conventional phase shifter indicates a more appropriate value at around 1.85 to 2.2 [pF] than the phase shifter 70, the phase shifter 70 explicitly indicates a more appropriate value than the conventional phase shifter as a whole. This is owing to the advantage of impedance-matching using Expression (6).

FIG. 11 is a graph comparing properties of phase shift. In FIG. 11, the vertical axis represents the amount of phase shift [deg], and the horizontal axis represents Cv [pF]. Also, the solid line 111 represents the amount of phase shift of the phase shifter 70, and the heavy line 112 represents the amount of phase shift of the conventional phase shifter. With the conventional phase shifter, even in the event that Cv is changed from 1.0 to 3.0 [pF], the obtained amount of phase shift is only around 146 [deg]. On the other hand, with the phase shifter 70, in the event that Cv is changed from 1.0 to 3.0 [pF] in the same way, the obtained amount of phase shift reaches around 264 [deg], more than the conventional phase shifter. Moreover, as can be understood from FIG. 11, the conventional phase shifter and the phase shifter 70 realize continuous change of the amount of phase shift caused by the continuous change of Cv. Note that the control unit 73, in a case of reducing the amount of phase shift, outputs the control signal V73 such as reducing Cv, and further, outputs the control signals V71 and V72 such as reducing C1 and C2 respectively. In a case of increasing the amount of phase shift, there is the need to perform the inverse control of the above-described control.

[Second Embodiment]

The configuration of a phase shifter according to a second embodiment of the present invention is shown in FIG. 12. As shown in FIG. 12, a phase shifter 120 according to the second embodiment comprises a phase shift unit including variable capacitors C121 through C125, variable capacitors Cv121 through Cv124, inductors L121 through L125, and a control unit 123. Note that the phase shifter according to the present embodiment includes no capacitors with fixed capacity, so a simplified notation with a capacitor mark is employed for all of the variable capacitors. The variable capacitor C121, inductor L121, variable capacitor C122, inductor L122, variable capacitor C123, inductor L123, variable capacitor C124, inductor L124, variable capacitor C125, and inductor L125 are serially connected between an input terminal 121 and output terminal 122, in that order. Moreover, one end of the variable capacitor Cv121 is connected to a node between the inductor L121 and variable capacitor C122, and the other end thereof is grounded. Furthermore, one end of the variable capacitor Cv122 is connected to a node between the inductor L122 and variable capacitor C123, and the other end thereof is grounded. Moreover, one end of the variable capacitor Cv123 is connected to a node between the inductor L123 and variable capacitor C124, and the other end thereof is grounded. Furthermore, one end of the variable capacitor Cv124 is connected to a node between the inductor L124 and variable capacitor C125, and the other end thereof is grounded.

A pair of the variable capacitor C121 and inductor L121, a pair of the variable capacitor C122 and inductor L122, a pair of the variable capacitor C123 and inductor L123, a pair of the variable capacitor C124 and inductor L124, and a pair of the variable capacitor C125 and inductor L125, each make up a reactance unit. Moreover, the variable capacitors Cv121 through Cv127 make up a susceptance unit. One reactance unit is serially connected with one susceptance unit.

The variable capacitors C121 and C125 are the same variable capacitance device, and the variable range of capacitance thereof (hereafter, this is represented as C1 in the present embodiment) is also the same. In the same way, the variable capacitors C122 through C124 are the same variable capacitance device, and the variable range of capacitance thereof (hereafter, this is represented as C2 in the present embodiment) is also the same. The variable capacitors Cv121 through Cv124 are the same variable capacitance device, and the variable range of capacitance thereof (hereafter, this is represented as Cv in the present embodiment) is also the same.

Also, the arrow extending from the control unit 123 represents a control signal line for transmitting a control signal to each variable capacitor. More specifically, a control signal line V121 is a signal line for transmitting the control signal V121 to the variable capacitors C121 through C125, and the variable capacitors Cv121 through Cv124. That is to say, with the present embodiment, an arrangement has been made wherein the common control signal is used as to all the variable capacitance devices. Thus, the control unit 123 needs to generate only one type of control signal, thereby facilitating the configuration of the control unit 123.

The circuit constant of each device in the phase shifter 120 according to the present embodiment, in a case that the use conditions for the phase shifter 120 are input/output impedance of 50 Ω and also a frequency of 1 GHz, is as follows, for example.

$C1 = k \cdot Cv \ [pF],$ $C2 = 0.5 \cdot k \cdot Cv \ [pF],$ $Cv = 1.0 \text{ to } 3.0 \ [pF],$ $L1 = 4.9 \ [nH], \text{ and}$ $L2 = 9.8 \ [nH].$ Here, L1 represents inductance for the inductors L121 and L125, and L2 represents inductance for the inductors L122 through L124. Also, k is a constant, and k=7, for example, with the present embodiment. In a case of realizing the specific amount θ of phase shift, the specific value within a variable region is determined such that Expression (6) is satisfied, i.e., impedance is matched. Further, with the present embodiment, C1 and C2 are represented with a function wherein Cv is multiplied by a constant. That is to say, C1, C2, and Cv have the predetermined capacity ratio as follows:

C1:C2:Cv=k:0.5k:1

This capacity ratio can be determined using the area ratio of variable capacitors, for example.

FIG. 13 illustrates a graph indicating the relation between Cv, C1, and C2 satisfying Expression (6). In FIG. 13, the vertical axis represents C1 and C2 [pF], and the horizontal axis represents Cv [pF]. The straight line 131 shown in a solid line represents the change of C1 when Cv changes from 1.0 to 3.0 [pF] by the control signal V121, and the straight line 132 shown in a dotted line represents the change of C2 when Cv changes from 1.0 to 3.0 [pF] by the control signal V121 in the same way. With the second embodiment, unlike the first embodiment, both C1 and C2 are controlled by the control signal V121. In this graph, in order to obtain a set of capacitance satisfying Expression (6), first, the value of Cv is determined. Next, the value of C1 is determined on the graph by the value of the vertical axis corresponding to the intersection between the line parallel to the vertical axis passing through the specific value of Cv, and the straight line 131 representing the change of C1. In the same way, the value of C2 is determined by the value of the vertical axis corresponding to the intersection between the line parallel to the vertical axis passing through the specific value of Cv, and the straight line 132 representing the change of C2 on the graph. In FIG. 13, for example, in the event that determination is made that Cv=2.0 [pF], C1 and C2 are determined that C1=around 14 [pF], and C2=around 7 [pF]. Thus, a set of capacitance of C1, C2, and Cv that satisfies Expression (6) is obtained. Note that according to the graph in FIG. 13, both the straight lines 131 and 132 are continuously increasing, and the control unit 123 outputs the same control signal V121 such as increasing or decreasing Cv, C1, and C2.

Description will be made regarding the design concept of a constant k according to the present embodiment with reference to FIGS. 14 and 15. With a phase shifter configured of a single unit element shown in FIG. 14, a variable capacitor C141, inductor L141, variable capacitor C143, and a inductor L142 are serially connected between an input terminal 141 and output terminal 142, in that order. One end of the variable capacitor C142 is connected to a node between the inductor L141 and the variable capacitor C143, and the other end thereof is grounded. The variable capacitor C141, inductor L141, variable capacitor C143, and the inductor L142 make up a reactance unit, and the variable capacitor C142 makes up a susceptance unit. The reactance unit and susceptance unit are T-connected.

Here, the impedance $Z_0$ of this phase shifter is as illustrated in the following Expression (7). Furthermore, solving Expression (7) regarding Lb yields Expression (8).

$$Z_0 = \sqrt{\frac{2\left(Lb - \frac{1}{Cb\omega^2}\right)}{Cv}} \quad (7)$$

$$Lb = \frac{Z_0^2 Cv}{2} + \frac{1}{Cv\omega^2} \quad (8)$$

wherein Cb represents the capacitance for the variable capacitors C141 and C143, Cv represents the capacitance for the variable capacitor C142, and Lb represents the inductance of the inductors L141 and L142.

Here, assuming that Cb=k·Cv (k is a constant greater than 0), the relation between Lb, Cv, and k is such as shown in the graph in FIG. 15. Note that with the present embodiment, the frequency used is 1 GHz, and accordingly, ω of Expression (8) is treated as a constant. In FIG. 15, the vertical axis represents Lb [nH], and the horizontal axis represents Cv [pF]. Each curve is graph of Lb in a case that Cv is a variable, and k varies in a discrete manner. More specifically, the curve 151 illustrated with the heavy dotted line shows a case of k=3, the curve 152 illustrated with the heavy line shows a case of k=4, the curve 153 illustrated with the two-dash broken line shows a case of k=5, the curve 154 illustrated with the dotted line shows a case of k=6, the curve 155 illustrated with the solid line shows a case of k=7, and the curve 156 illustrated with the one-dash broken line shows a case of k=8, respectively. In the graph shown in FIG. 15, while Lb varies according to the variance of Cv, Lb is originally fixed inductance, so it is desirable to reduce the variance in this assumption. The amount of variance of the curves 151 through 156 differs one from another, and accordingly, a condition with the least amount of variance is preferably selected. Reading the amount of variance of each curve gives at least 2.4 [nH] regarding the curve 151, around 2 [nH] regarding the curve 152, around 1.3 [nH] regarding the curve 153, around 1 [nH] regarding the curve 154, around 0.7 [nH] regarding the curve 155, and around 0.8 [nH] regarding the curve 156. That is to say, the amount of variance of the curve 155 indicating a case of k=7 is the least value. Accordingly, with the present embodiment, k=7 is employed, for example. However, k does not need to be an integer, so a value close to 7 may be substituted instead. Moreover, in a case that the use condition such as the frequency of the phase shifter, and the like is changed, there is the need to recalculate the value of k according to this change, and consequently, there is a case that a value far removed from 7 may be employed.

Figure 16:
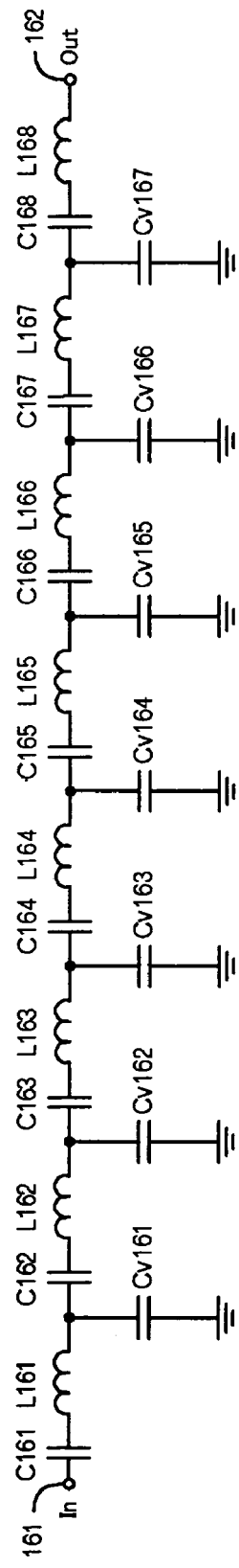
FIG. 16 is a diagram illustrating the configuration of a phase shifter in comparison with a phase shifter according to the second embodiment of the present invention.

Description will be made regarding the properties of the phase shifter 120 according to the present embodiment with reference to FIGS. 16 through 18. Let us say that comparison is made with a phase shifter 160 such as shown in FIG. 16. The number of unit elements made up of a reactance unit and a susceptance unit of the phase shifter 160 is different from that of the phase shifter 120, which has been designed such that impedance is matched when the capacitance of the variable capacitor in a susceptance unit is 2.0 [pF].

As shown in FIG. 16, the phase shifter 160 includes variable capacitors C161 through C168, variable capacitors Cv161 through Cv167, and inductors L161 through L168. The variable capacitor C161, inductor L161, variable capacitor C162, inductor L162, variable capacitor C163, inductor L163, variable capacitor C164, inductor L164, variable capacitor C165, inductor L165, variable capacitor C166, inductor L166, variable capacitor C167, inductor L167, variable capacitor C168, and the inductor L168 are serially connected between an input terminal 161 and output terminal 162, in that order. Moreover, one end of the variable capacitor Cv161 is connected to a node between the inductor L161 and variable capacitor C162, and the other end thereof is grounded. Furthermore, one end of the variable capacitor Cv162 is connected to a node between the inductor L162 and variable capacitor C163, and the other end thereof is grounded. Moreover, one end of the variable capacitor Cv163 is connected to a node between the inductor L163 and variable capacitor C164, and the other end thereof is grounded. Furthermore, one end of the variable capacitor Cv164 is connected to a node between the inductor L164 and variable capacitor C165, and the other end thereof is grounded. Moreover, one end of the variable capacitor Cv165 is connected to a node between the inductor L165 and variable capacitor C166, and the other end thereof is grounded. Furthermore, one end of the variable capacitor Cv166 is connected to a node between the inductor L166 and variable capacitor C167, and the other end thereof is grounded. Moreover, one end of the variable capacitor Cv167 is connected to a node between the inductor L167 and variable capacitor C168, and the other end thereof is grounded.

A pair of the variable capacitor C161 and inductor L161, a pair of the variable capacitor C162 and inductor L162, a pair of the variable capacitor C163 and inductor L163, a pair of the variable capacitor C164 and inductor L164, a pair of the variable capacitor C165 and inductor L165, a pair of the variable capacitor C166 and inductor L166, a pair of the variable capacitor C167 and inductor L167, a pair of the variable capacitor C168 and inductor L168 each make up a reactance unit. Moreover, the variable capacitors Cv161 through Cv167 each make up a susceptance unit. One reactance unit is serially connected with one susceptance unit.

The variable capacitors C161 and C168 are the same variable capacitance device, and the variable range of capacitance thereof (hereafter, this is represented as C1$a$ in the present embodiment) is also the same. In the same way, the variable capacitors C162 through C167 are the same variable capacitance device, and the variable range of capacitance thereof (hereafter, this is represented as C2$a$ in the present embodiment) is also the same. The variable capacitors Cv161 through Cv167 are the same variable capacitance device, and the variable range of capacitance thereof (hereafter, this is represented as Cva in the present embodiment) is also the same.

In a case that the use conditions are the same as those in the phase shifter 120, the circuit constant of each device in the phase shifter 160, is as follows, for example.

$C1a = ka \cdot Cva$ [pF], $C2a = 0.5 \cdot ka \cdot Cva$ [pF], and

Cva=1.0 to 3.0 [pF] wherein ka is a constant, and ka=3 holds for the phase shifter 160. Note that the inductance of the inductors L161 and L168 is set to around 6.8 [nH], and the inductance of the inductors L162 through L167 is set to around 13.6 [nH] such that impedance is matched at ka=3 and Cva=2.0 [pF] in FIG. 15. As can be understood from the curve 151 of k=3 in FIG. 15, in a case that the inductors L161 through L168 are set fixedly, impedance cannot be matched at the parts other than Cva=2.0 [pF].

Figure 17:
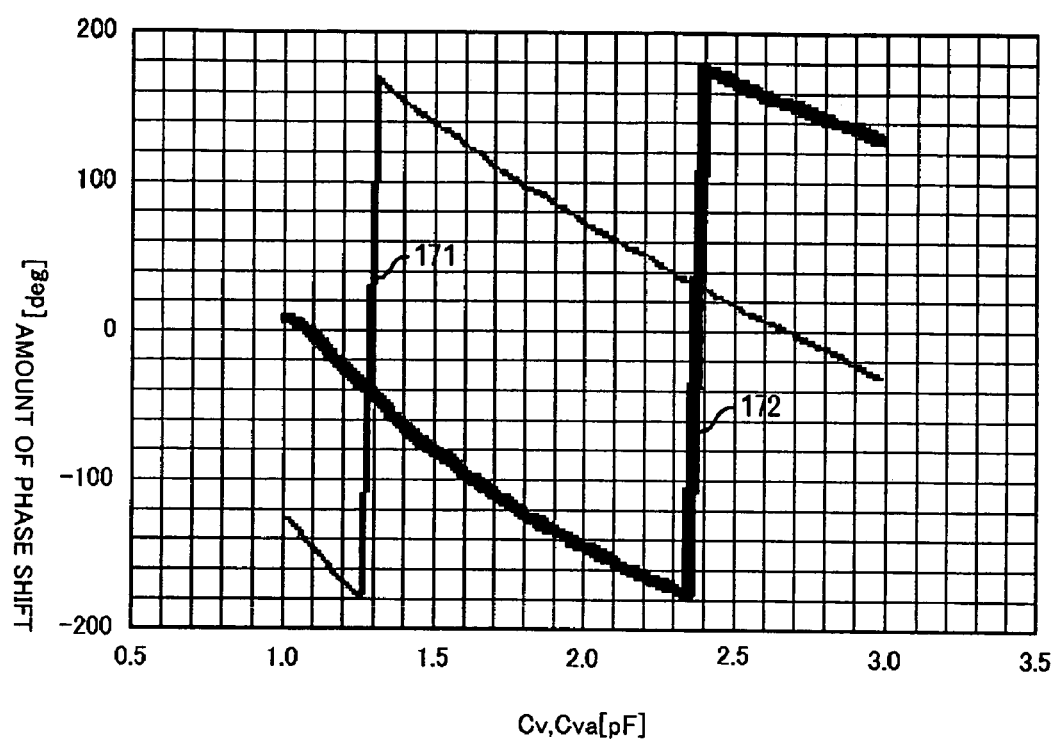
FIG. 17 is a diagram illustrating the phase shift property of a phase shifter in comparison with a phase shifter according to the second embodiment of the present invention.

FIG. 17 illustrates a graph comparing properties of phase shift. In FIG. 17, the vertical axis represents the amount of phase shift [deg], and the horizontal axis represents Cv or Cva [pF]. Also, the solid line 171 represents the amount of phase shift of the phase shifter 120, and the heavy line 172 represents the amount of phase shift of the phase shifter 160. With the phase shifter 160, in the event that Cva is changed from 1.0 to 3.0 [pF], the obtained amount of phase shift reaches around 245 [deg]. On the other hand, with the phase shifter 120, in the event that Cv is changed in the same way, the obtained amount of phase shift is around 260 [deg]. Consequently, the amount of phase shift in the phase shifter 120 is somewhat greater than that in the phase shifter 160. Moreover, as can be understood from FIG. 17, the phase shifter 120 realizes continuous change of the amount of phase shift caused by the continuous change of Cv.

Figure 18:
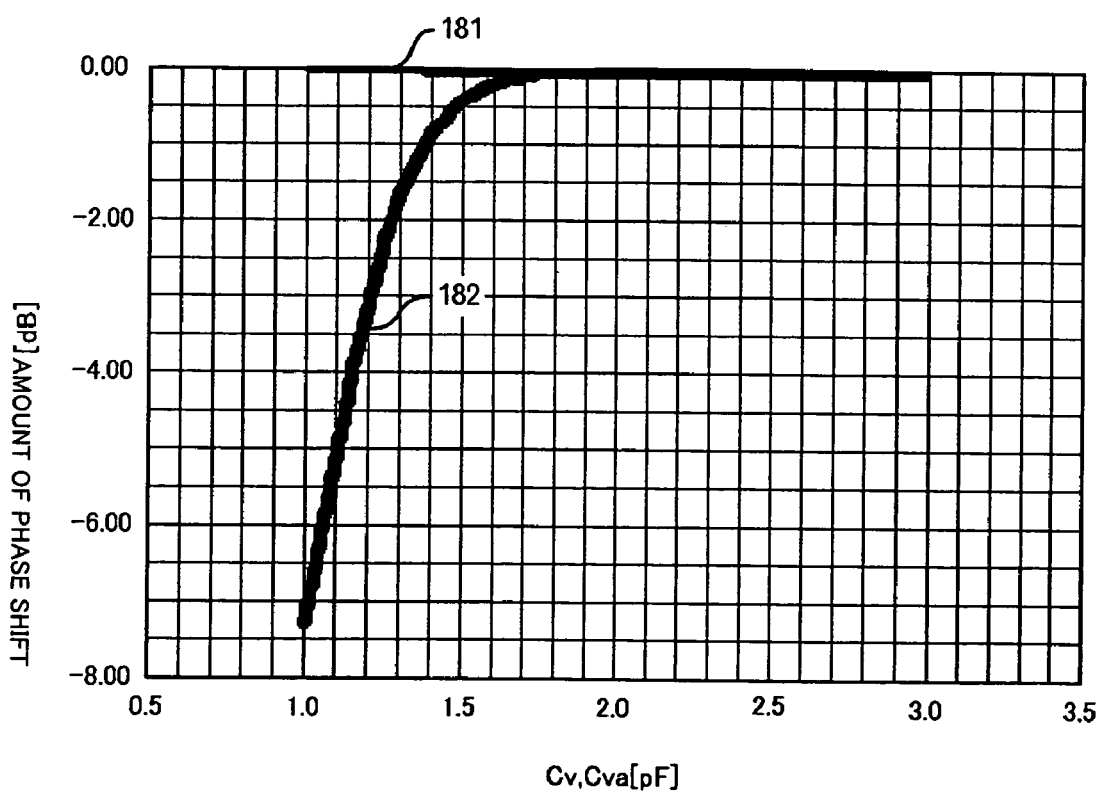
FIG. 18 is a diagram illustrating the passing amount of a phase shifter in comparison with a phase shifter according to the second embodiment of the present invention.

FIG. 18 illustrates a graph comparing passing amount. In FIG. 18, the vertical axis represents passing amount [dB], and the horizontal axis represents Cv or Cva [pF]. Also, the solid line 181 represents the passing amount of the phase shifter 120, and the heavy line 182 represents the passing amount of the phase shifter 160. With the phase shifter 160, while the passing amount indicates 0 [dB] at 2.0 [pF] in accordance with the design thereof, in a case that Cva becomes smaller than 2.0 [pF], the passing property rapidly deteriorates, indicating a small value around −7.5 [dB] at 1.0 [pF]. On the other hand, with phase shifter 120, the passing amount indicates around 0 [dB] in a range from 1.0 to 3.0 [pF], thereby maintaining a good passing property. Thus, better properties regarding passing amount and the amount of phase shift can be obtained by selecting an appropriate k so as to match impedance as much as possible even in the event that inductance is fixed.

Note that in a case of increasing the amount of phase shift, the control unit 123 outputs a control signal such as increasing Cv. Also, in FIG. 13, an arrangement has been made wherein the control signal such as increasing Cv increases C1 and C2 as well.

[Third Embodiment]

Figure 19:
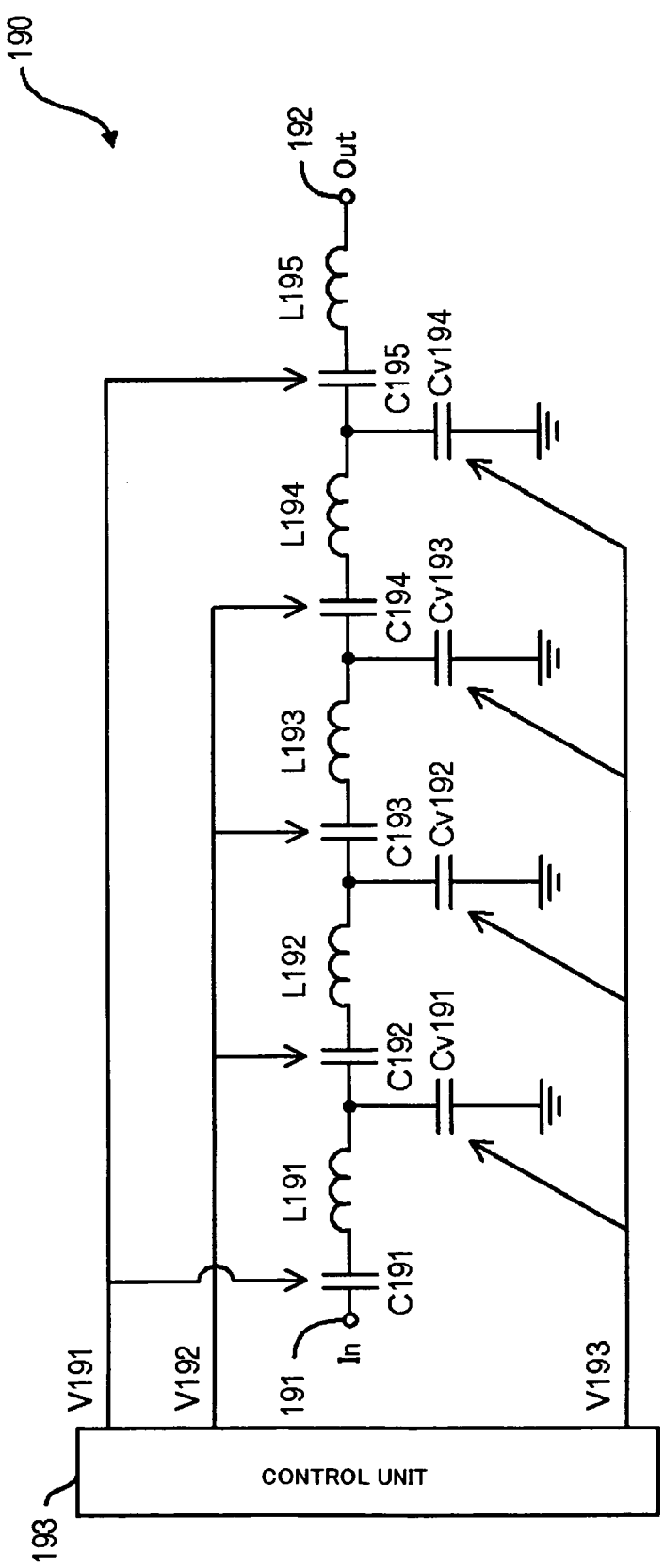
FIG. 19 is a diagram illustrating the configuration of a phase shifter according to a third embodiment of the present invention.

The configuration of a phase shifter according to a third embodiment of the present invention will be shown in FIG. 19. As shown in FIG. 19, a phase shifter 190 according to the third embodiment comprises a phase shift unit including variable capacitors C191 through C195, variable capacitors Cv191 through Cv194, and inductors L191 through L195, and a control unit 193. Note that the phase shifter according to the present embodiment includes no capacitors with fixed capacity, so a simplified notation of a capacitor mark is employed for all of the variable capacitors. The variable capacitor C191, inductor L191, variable capacitor C192, inductor L192, variable capacitor C193, inductor L193, variable capacitor C194, inductor L194, variable capacitor C195, and inductor L195 are serially connected between an input terminal 191 and output terminal 192, in that order. Moreover, one end of the variable capacitor Cv191 is connected to a node between the inductor L191 and variable capacitor C192, and the other end thereof is grounded. Furthermore, one end of the variable capacitor Cv192 is connected to a node between the inductor L192 and variable capacitor C193, and the other end thereof is grounded. Moreover, one end of the variable capacitor Cv193 is connected to a node between the inductor L193 and variable capacitor C194, and the other end thereof is grounded. Furthermore, one end of the variable capacitor Cv194 is connected to a node between the inductor L194 and variable capacitor C195, and the other end thereof is grounded.

A pair of the variable capacitor C191 and inductor L191, a pair of the variable capacitor C192 and inductor L192, a pair of the variable capacitor C193 and inductor L193, a pair of the variable capacitor C194 and inductor L194, and a pair of the variable capacitor C195 and inductor L195 each make up a reactance unit. Moreover, the variable capacitors Cv191 through Cv194 each make up a susceptance unit. One reactance unit is serially connected with one susceptance unit.

The variable capacitors C191 and C195 are the same variable capacitance device, and the variable range of capacitance thereof (hereafter, this is represented as C1 in the present embodiment) is also the same. In the same way, the variable capacitors C192 through C194 are the same variable capacitance device, and the variable range of capacitance thereof (hereafter, this is represented as C2 in the present embodiment) is also the same. The variable capacitors Cv191 through Cv194 are the same variable capacitance device, and the variable range of capacitance thereof (hereafter, this is represented as Cv in the present embodiment) is also the same.

Also, the arrow extending from the control unit 193 represents a control signal line for transmitting a control signal to each variable capacitor. More specifically, a control signal line V191 is a signal line for transmitting the control signal V191 to the variable capacitors C191 and C195, a control signal line V192 is a signal line for transmitting the control signal V192 to the variable capacitors C192 through C194, a control signal line V193 is a signal line for transmitting the control signal V193 to the variable capacitors Cv191 through Cv194. That is to say, an arrangement has been made wherein the common control signal is used as to the same variable capacitance device. However, with the present embodiment, an arrangement has been made wherein the control unit 193 outputs an independent control signal to the control signal lines V191 through V193 respectively.

The circuit constant of each device in the phase shifter 190 according to the present embodiment, in a case that the use conditions for the phase shifter 190 are input/output impedance of 50 Ω and also a frequency of 44 GHz, is as follows.

C1=0.0141 through 0.0229 [pF],
C2=0.007 to 0.0115 [pF],
Cv=0.052 through 0.073 [pF],
L1=1 [nH], and
L2=2 [nH].

Here, L1 represents inductance for the inductors L191 and L195, and L2 represents inductance for the inductors L192 through L194. In a case of realizing the specific amount θ of phase shift, the specific value within a variable region is determined such that Expression (6) is satisfied, i.e., impedance is matched. The process reaching the determination will be described later.

Figure 20:
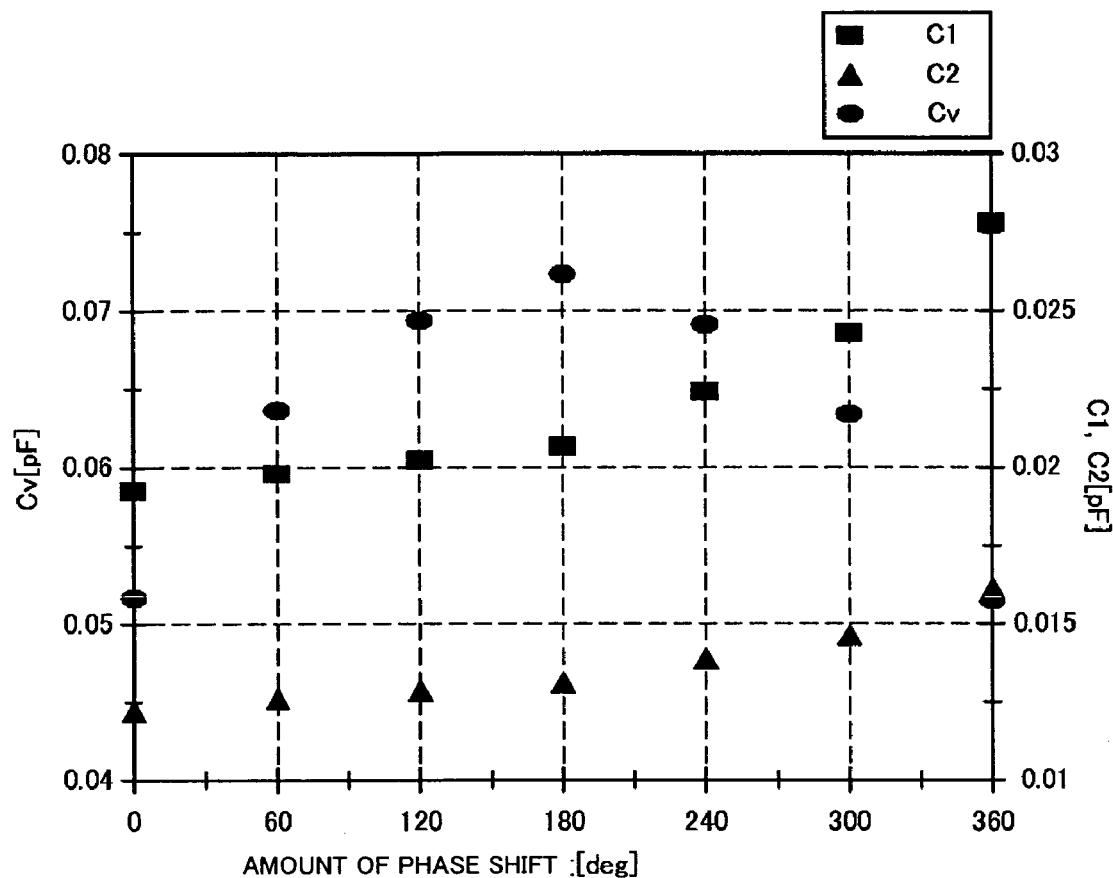
FIG. 20 is an explanatory diagram describing the control of a phase shifter according to the third embodiment of the present invention.

FIG. 20 illustrates a graph indicating the relation between Cv, C1, and C2 satisfying Expression (6), and the amount of phase shift of the phase shifter 190. In FIG. 20, the right vertical axis represents C1 and C2 [pF], the left vertical axis represents Cv [pF], and the horizontal axis represents the amount of phase shift [pF] of the phase shifter 190. Moreover, the square points plotted represent the value of C1 to be realized by the control signal V191 in the specific amount of phase shift, the triangular points plotted represent the value of C2 to be realized by the control signal V192 in the specific amount of phase shift, and the elliptical points plotted represent the value of Cv to be realized by the control signal V193 in the specific amount of phase shift. In order to obtain the specific amount θ of phase shift while satisfying Expression (6), a value set of C1, C2, and Cv plotted corresponding to the specific amount θ of phase shift should be employed.

Description will be made regarding the determination of the circuit constants of phase shifter 190 according to the present embodiment with reference to FIGS. 21 and 22. The scope of the design concept is to set a transfer function to 1 in a single unit element. That is to say, this means an idea wherein the passing amount of the entire phase shifter 190 is set to 0 [dB] by setting the passing loss of a single unit element to 0 [dB].

Figure 21:
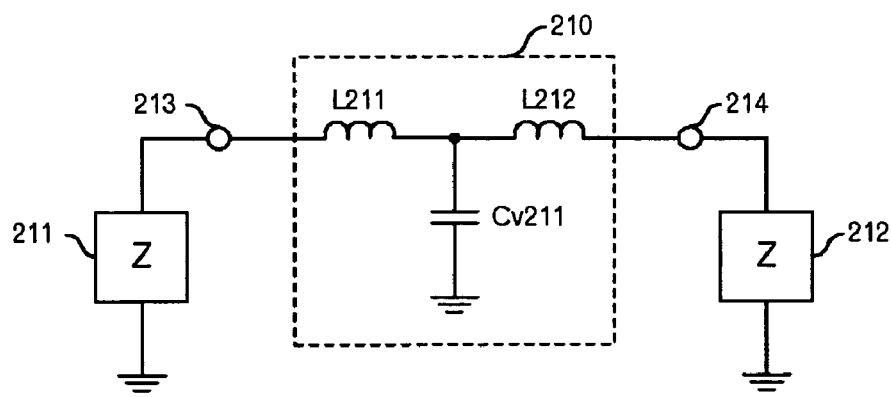
FIG. 21 is an explanatory diagram describing the design concept regarding circuit constant determination according to the third embodiment of the present invention.

First, let us assume a phase shifter 210 made up of a single unit element such as shown in FIG. 21. An input terminal 213 of the phase shifter 210 is connected to an input port 211 of inner impedance of Z. Moreover, an output terminal 214 of the phase shifter 210 is connected to an output port 212 of inner impedance of Z. With the phase shifter 210, inductors L211 and L212 having the same inductance are serially connected from the input side to the output side. One end of a variable capacitor Cv211 is connected to a node between the inductors L211 and L212, and the other end thereof is grounded. The inductors L211 and L212 make up a reactance unit, and the variable capacitor Cv211 makes up a susceptance unit. Note that let us assume that the impedance Z of circuits 211 and 212 is Z=50 Ω in accordance with the use conditions of the phase shifter 190. In the same way, let us assume that the use frequency of the phase shifter 210 is 44 GHz, the same as that of the phase shifter 190.

Further, let us assume that reactance for the reactance unit is X, susceptance for the susceptance unit is B, inductance for the inductors L211 and L212 is La, specific capacitance within a variable region of the variable capacitor Cv211 is Cva, and an angular frequency is ω, thereby realizing the following two expressions.

$$X = \omega La \quad (9)$$

$$B = \omega Cva \quad (10)$$

At this time, the transfer function of phase shifter 210 is shown the following Expression (11). An expression for obtaining the amount of phase shift is expressed as Expression (12) wherein the real part in the numerator of Expression (11) becomes the denominator thereof, and the imaginary part of Expression (11) becomes the numerator thereof. Further, in a case of assuming that the desired amount of phase shift is 300° (or −60°), solving Expression (12) regarding X yields Expression (13).

$$\frac{\frac{2}{iB}Z}{(Z+iX)\left(Z+iX+\frac{2}{iB}\right)} = \frac{2Z[2Z(1-XB)+i(X^2B-2X-BZ^2)]}{(Z+iX)(Z-iX)(2-XB+iBZ)(2-XB-iBZ)} \quad (11)$$

$$\text{AMOUNT OF PHASE SHIFT} = \tan^{-1}\frac{X^2B - BZ^2 - 2X}{2Z(1-XB)} \quad (12)$$

$$X = \frac{1}{2B}\left[2\sqrt{3}ZB + 2 - 2\sqrt{4B^2Z^2+1}\right] \quad (13)$$

Figure 22:
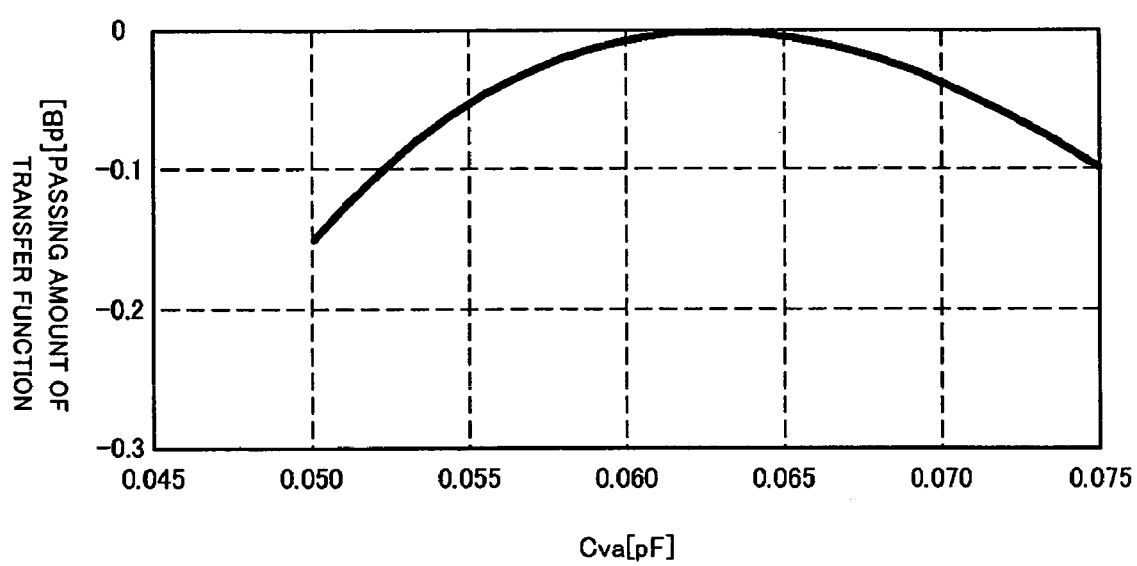
FIG. 22 is an explanatory diagram describing the design concept regarding circuit constant determination according to the third embodiment of the present invention.

FIG. 22 illustrates a graph representing the relation between Cva and the passing amount of the transfer function in a case of assuming that the amount of phase shift of the phase shifter 210 is 300° (or −60°). In FIG. 22, the vertical axis represents the passing amount [dB] of the transfer function, and the horizontal axis represents Cva [pF]. The curve shown in FIG. 22 is high at the middle and low at both ends, the passing amount of the transfer function exhibits 0 [dB] in a case that Cva is around 0.063 [pF]. In other words, in a case of assuming that the amount of phase shift of the phase shifter 210 is 300° (or −60°), the adjustment value Cva of the variable capacitor Cv211 for realizing that the transfer function of the phase shifter 210 is equal to 1 is around 0.063 [pF]. As the use frequency of the phase shifter 210 is fixed, ω is treated as a constant, whereby determining Cva results in obtaining B from Expression (10). As described above, the impedance Z is 50 ω, and accordingly, determining B results in obtaining L from Expressions (13) and (9) sequentially, and consequently, the circuit constants of all the devices included in the phase shifter 210 are determined. Note that La is determined to be 0.104 [nH] in the phase shifter 210.

Next, let us study applying the principle shown in the phase shifter 210 to the phase shifter 190. As described in "General Concept of the Invention", an inductor can be substituted with the serial connection of an inductor and a capacitor, and a variable inductor can be substituted with the serial connection of an inductor having fixed inductance and a variable capacitor. With an embodiment of the present invention, a variable capacitor is employed in a reactance unit, and accordingly assuming that the inductors L211 and L212 are both variable inductors, in a case of applying the principle of the phase shifter 210 to the phase shifter 190. Accordingly, both the inductors L211 and L212 can be substituted with an inductor having fixed inductance and a variable capacitor. As the relation between inductance and capacitance is such as shown in Expression (4) following the substitution, C1 and L1 in the phase shifter 190 can be determined by Expression (4) being applied thereto. Furthermore, with the phase shifter 190, a variable capacitor of which capacitance is C2 is an equivalent circuit of a circuit wherein two variable capacitors of which capacitance is C1 are serially connected, and also an inductor of which inductance is L2 is an equivalent circuit of a circuit wherein two inductors of which inductance is L1 are serially connected. That is to say, the following two expressions hold:

$$C2=0.5 \cdot C1$$

$$L2=2 \cdot L1$$

Accordingly, C2 and L1 are also obtained.

Thus, with the phase shifter 190, a capacitance set of C1, C2, and Cv regarding the specific amount of phase shift is determined. While description has been made wherein the amount of phase shift is 300° (or −60°), a capacitance set of C1, C2, and Cv may be applied to arbitrary amount of phase shift in the same way. Indicating the results in 60° interval results in the graph such as illustrated in FIG. 20. With the graph illustrated in FIG. 20, the values of C1, C2, and Cv are seemingly shown in a discrete state. However, connecting the points plotted regarding C1, C2, and Cv respectively results in smooth curves. That is to say, the curves of C1 and C2 are constantly-increasing curves, and the curve of Cv is high at the middle and low at both ends. In other words, in a case of continuously changing the amount of phase shift of the phase shifter 190, the control unit 193 should continuously change the values of C1, C2, and Cv so as to follow each curve. Note that the control unit 193 outputs the control signals V191 and V192 for increasing C1 and C2 respectively in a case that the control unit 193 outputs the control signal 193 within a range between 0 and 180 [deg] of the amount of phase shift.

As described above, the phase shifter 190 according to the present embodiment is controlled such that the passing amount is 0 [db] of the transfer function in the desired amount of phase shift, thereby realizing a phase shifter having excellent passing property. Also, as shown in FIG. 20, a phase shifter capable of continuously changing the amount of phase shift up to 360° is realized.

[Fourth Embodiment]

Figure 23:
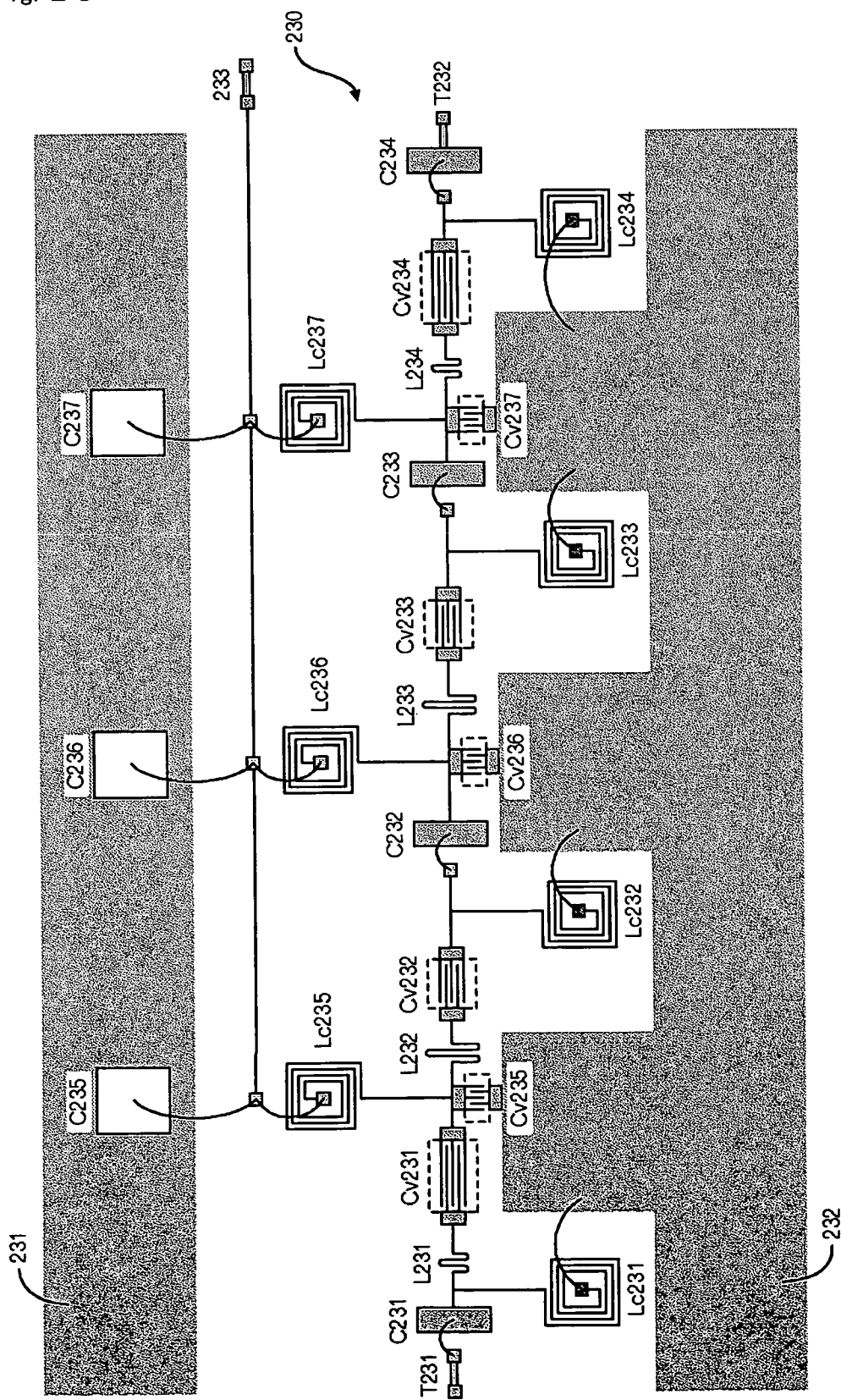
FIG. 23 is a diagram illustrating the configuration of a phase shifter (mounting example) according to a fourth embodiment of the present invention.

FIG. 23 illustrates an mounting example of a phase shifter according to a fourth embodiment of the present invention. A phase shifter 230 according to the fourth embodiment shown in FIG. 23 has a configuration wherein devices are mounted on a semiconductor substrate based on the design concept of the phase shifter 120 according to the second embodiment of the present invention. However, there is a difference in the number of unit elements made up of a reactance unit and a susceptance unit as compared with the phase shifter 120.

Figure 24:
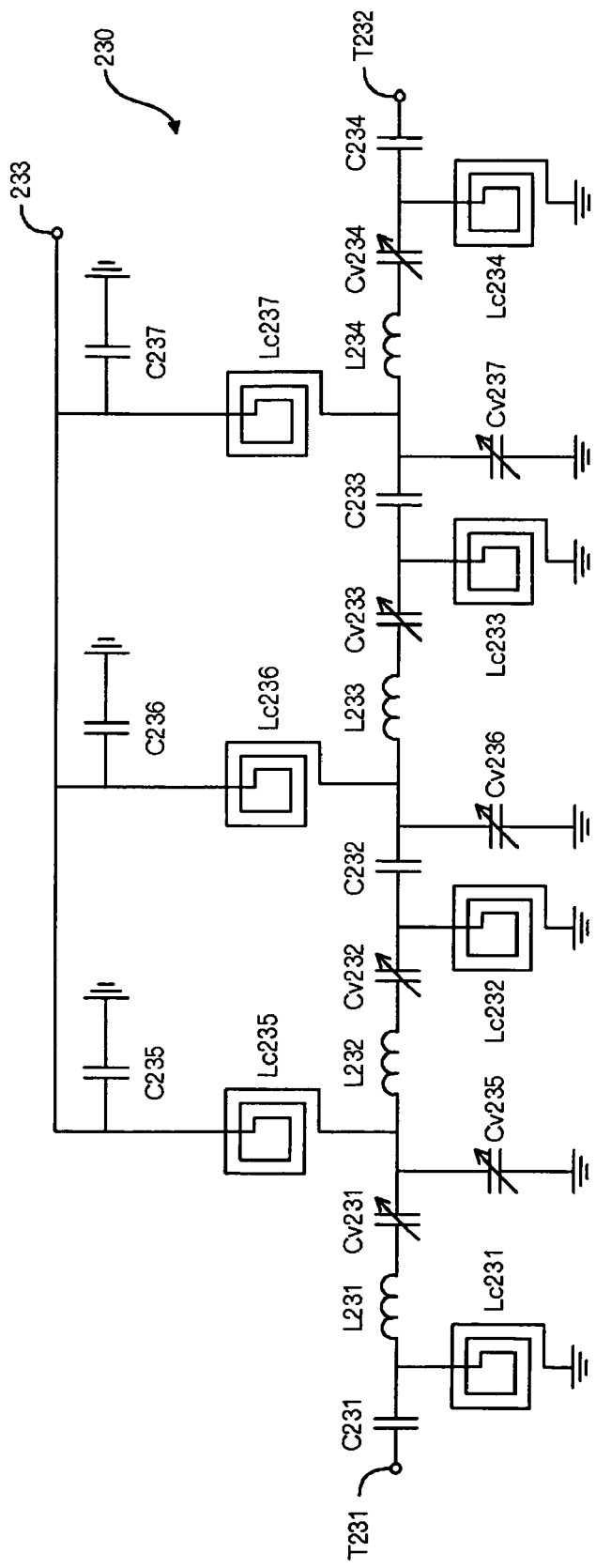
FIG. 24 is a diagram illustrating the configuration of a phase shifter (circuit) according to the fourth embodiment of the present invention.
Figure 2:
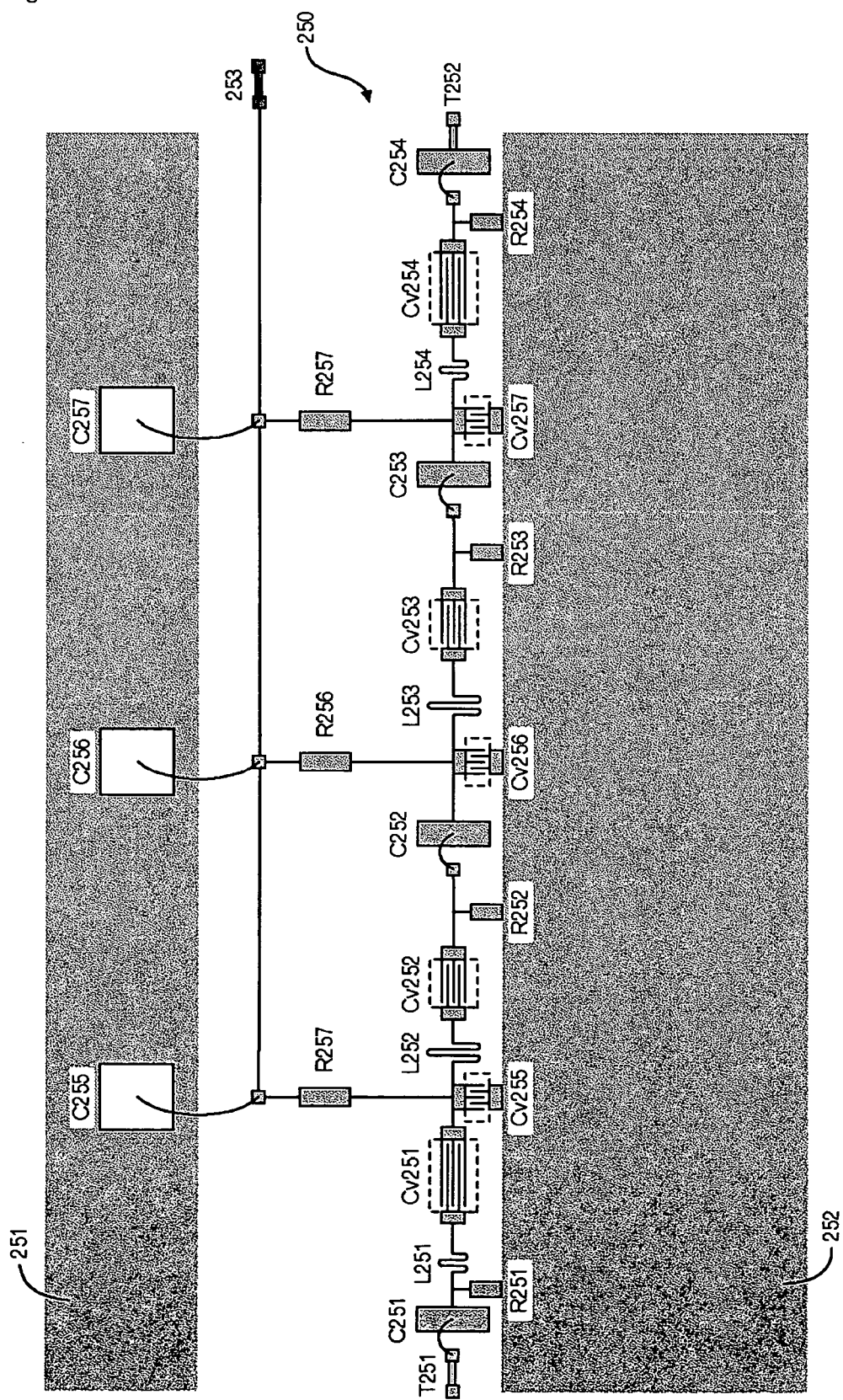
FIG. 2 is a diagram illustrating the configuration of an antenna included in an antenna application.

With regard to connection relations, description will be made with reference to FIG. 24. FIG. 24 is the circuit diagram of the phase shifter 230, and all reference numerals used are common to those in FIG. 23. That is to say, the same reference numeral denotes the same circuit device. However, in FIG. 24, ground 231 and 232 are shown in minimal size, and accordingly reference numerals thereof are omitted. The phase shifter 230 comprises a phase shift unit including coupling capacitors C231 through C234, inductors L231 through L234, variable capacitors Cv231 through Cv237, and choke inductors Lc231 through Lc234; a control line unit including choke inductors Lc235 through Lc237, and bypass capacitors C235 through C237; an input terminal T231 and output terminal T232; and ground 231 and 232.

The coupling capacitor C231, inductor L231, variable capacitor Cv231, inductor L232, variable capacitor Cv232, coupling capacitor C232, inductor L233, variable capacitor Cv233, coupling capacitor C233, inductor L234, variable capacitor Cv234, and the coupling capacitor C234 are serially connected between the input terminal T231 and output terminal T232, in that order.

Moreover, one end of the choke inductor Lc231 is connected to a node between the coupling capacitor C231 and inductor L231, and the other end thereof is connected to the ground 232. Furthermore, one end of the choke inductor Lc235 and one end of the variable capacitor Cv235 are connected to a node between the variable capacitor Cv231 and inductor L232, and the other end of the variable capacitor Cv235 is connected to the ground 232. The other end of the choke inductor Lc235 is connected to one end of a control voltage terminal 233 and one end of the bypass capacitor C235, and the other end of the bypass capacitor C235 is connected to the ground 231. Moreover, one end of the choke inductor Lc232 is connected to a node between the variable capacitor Cv232 and coupling capacitor C232, and the other end of the choke inductor Lc232 is connected to the ground 232. Furthermore, one end of the choke inductor Lc236 and one end of the variable capacitor Cv236 are connected to a node between the coupling capacitor C232 and inductor L233, and the other end of the variable capacitor Cv236 is connected to the ground 232. The other end of the choke inductor Lc236 is connected to the control voltage terminal 233 and one end of the bypass capacitor C236, and the other end of the bypass capacitor C236 is connected to the ground 231. Moreover, one end of the choke inductor Lc233 is connected to a node between the variable capacitor Cv233 and coupling capacitor C233, and the other end thereof is connected to the ground 232. Furthermore, one end of the choke inductor Lc237 and one end of the variable capacitor Cv237 are connected to a node between the coupling capacitor C233 and inductor L234, and the other end of the variable capacitor Cv237 is connected to the ground 232. The other end of the choke inductor Lc237 is connected to the control voltage terminal 233 and one end of the bypass capacitor C237, and the other end of the bypass capacitor C237 is connected to the ground 231. Moreover, one end of the choke inductor Lc234 is connected to a node between the variable capacitor Cv234 and coupling capacitor C234, and the other end thereof is connected to the ground 232.

A pair of the inductor L231 and variable capacitor Cv231, a pair of the inductor L232 and variable capacitor Cv232, a pair of the inductor L233 and variable capacitor Cv233, a pair of the inductor L234 and variable capacitor Cv234 each make up a reactance unit. Moreover, the variable capacitors Cv235 through Cv237 each make up a susceptance unit. One reactance unit is serially connected with one susceptance unit.

Note that the bypass capacitors C235 through C237 and choke inductors Lc235 through Lc237 are devices for applying control voltage to the variable capacitors Cv231 through Cv237. On the other hand, the coupling capacitors C231 through C234 are capacitors for cutting off the direct-current components of control voltage applied to the variable capacitors Cv231 through Cv237.

The variable capacitors Cv231 and Cv234 are the same variable capacitance device, and the variable range of capacitance thereof (hereafter, this is represented as C1 in the present embodiment) is also the same. In the same way, the variable capacitors Cv232 and Cv233 are the same variable capacitance device, and the variable range of capacitance thereof (hereafter, this is represented as C2 in the present embodiment) is also the same. The variable capacitors Cv235 through Cv237 are the same variable capacitance device, and the variable range of capacitance thereof (hereafter, this is represented as Cv in the present embodiment) is also the same.

As shown in FIG. 24, the control signal (control voltage) of the phase shifter 230 is input from the control voltage terminal 233 alone. More specifically, the control signal input from the control voltage terminal 233 is transmitted to the variable capacitors Cv231 through Cv237. That is, with the present embodiment, an arrangement has been made wherein the common control signal is used as to all the variable capacitance devices, in the same way as the second embodiment. Thus, an unshown control unit needs to generate only one type of control signal, thereby facilitating the configuration of the control unit.

The capacitance of the variable capacitance devices in the phase shifter 230 according to the present embodiment is determined by the same concept as with the phase shifter 120 according to the second embodiment. That is to say, $C1 = k \cdot Cv$ [pF], and $C2 = 0.5 \cdot k \cdot Cv$ [pF] wherein $k$ is a constant.

Accordingly, the capacity ratio thereof is

C1:C2:Cv=k:0.5k:1.

This capacity ratio may be realized using the area ratio of a variable capacitor for example, in FIG. 23, the area of each variable capacitor is indicated with a dotted-line frame, which represents that the above capacity ratio has been realized with the area ratio of the variable capacitor, though not strictly.

[Fifth Embodiment]

FIG. 25 illustrates an mounting example of a phase shifter according to a fifth embodiment of the present invention. A phase shifter 250 according to the fifth embodiment shown in FIG. 25 has a configuration wherein all the choke inductors included in the phase shifter 230 according to the fourth embodiment are substituted with high-resistive devices. Since a choke inductor is equivalent to a high-resistive device (hereafter, referred to as resistance) under a predetermined condition, the phase shifter 250 is equivalent to the phase shifter 230 in effect. Note that the phase shifter 250, in the same way as the phase shifter 230, has a configuration wherein devices are mounted on a semiconductor substrate based on the design concept of the phase shifter 120 according to the second embodiment of the present invention. However, there is a difference in the number of unit elements made up of a reactance unit and a susceptance unit as compared with the phase shifter 120.

Figure 26:
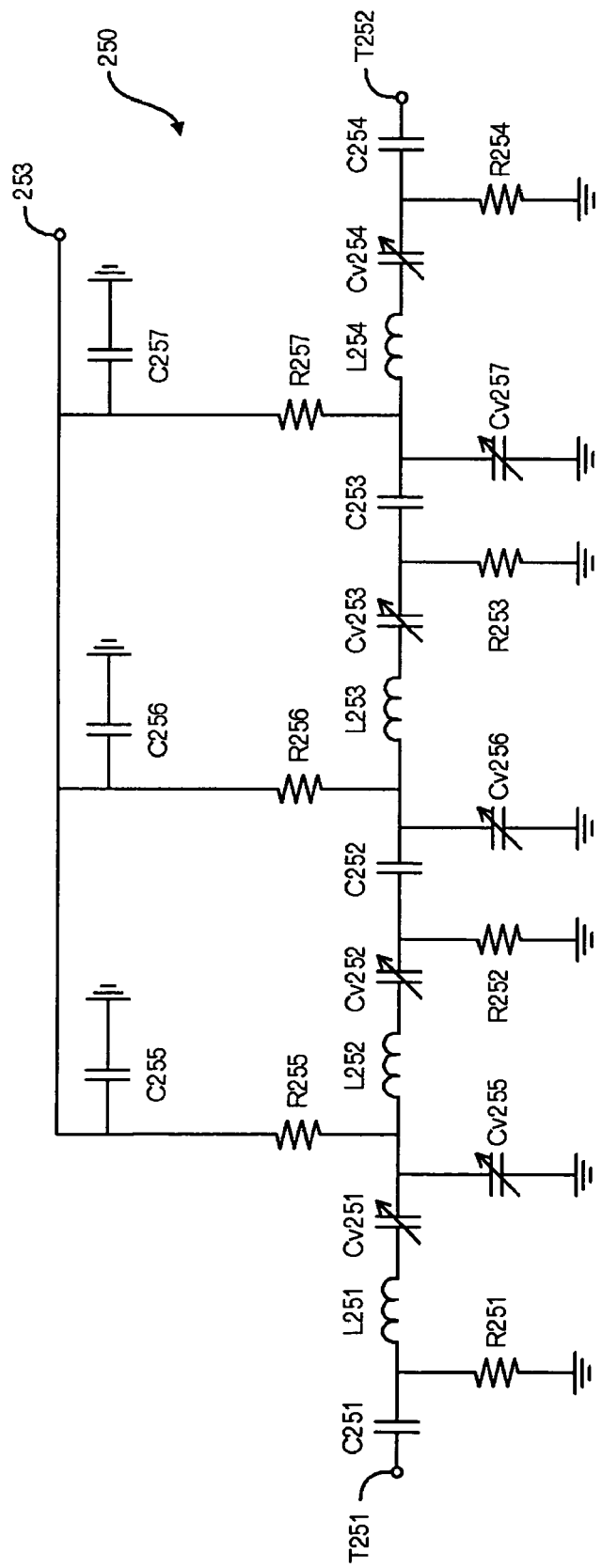
FIG. 26 is a diagram illustrating the configuration of a phase shifter (circuit) according to the fifth embodiment of the present invention.
Figure 27:
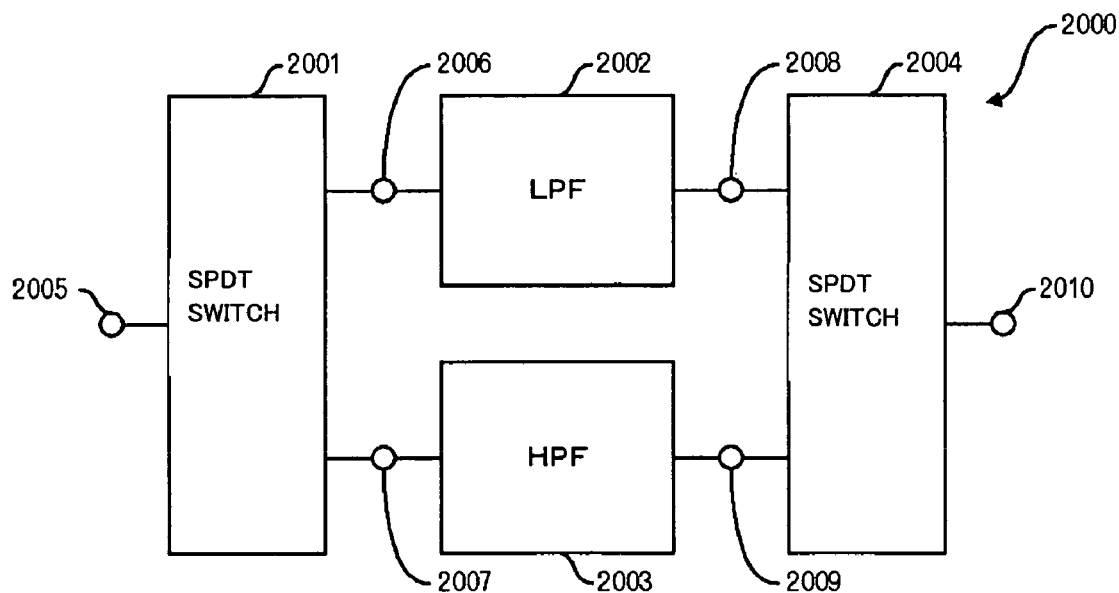
FIG. 27 is a diagram illustrating the configuration of a conventional phase shifter.
Figure 28:
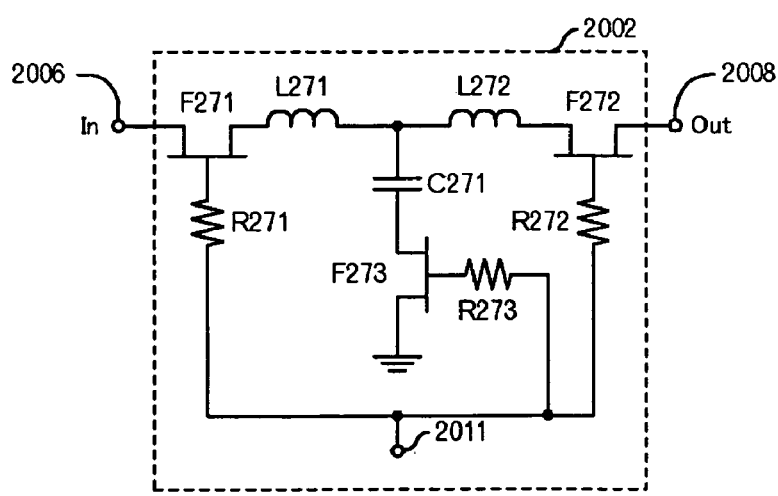
FIG. 28 is a diagram illustrating a part of the configuration of a conventional phase shifter.
Figure 29:
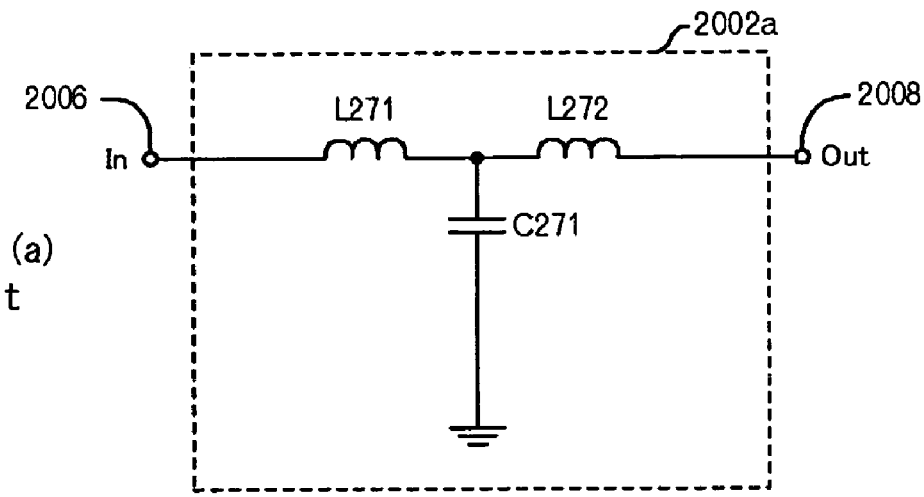
FIGS. 29A and 29B are explanatory diagrams describing the principle of operation of a conventional phase shifter.
Figure 29:
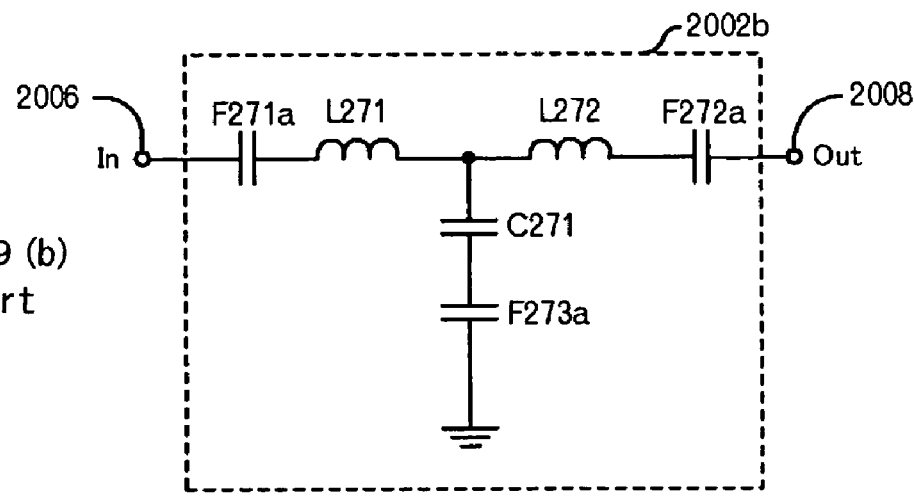

With regard to connection relations, description will be made with reference to FIG. 26. FIG. 26 is the circuit diagram of the phase shifter 250, and all reference numerals used are common to those in FIG. 25. That is to say, the same reference numeral denotes the same circuit device. However, in FIG. 26, ground 251 and 252 are shown in minimal size, and accordingly reference numerals thereof are omitted. The phase shifter 250 comprises a phase shift unit including coupling capacitors C251 through C254, inductors L251 through L254, variable capacitors Cv251 through Cv257, and resistances R251 through R254; a control line unit including resistances R255 through R257, and bypass capacitors C255 through C257; an input terminal T251 and output terminal T252; and ground 251 and 252.

The coupling capacitor C251, inductor L251, variable capacitor Cv251, inductor L252, variable capacitor Cv252, coupling capacitor C252, inductor L253, variable capacitor Cv253, coupling capacitor C253, inductor L254, variable capacitor Cv254, and the coupling capacitor C254 are serially connected between the input terminal T251 and output terminal T252, in that order.

Moreover, one end of the resistance R251 is connected to a node between the coupling capacitor C251 and inductor L251, and the other end thereof is connected to the ground 252. Furthermore, one end of the resistance R255 and one end of the variable capacitor Cv255 are connected to a node between the variable capacitor Cv251 and inductor L252, and the other end of the variable capacitor Cv255 is connected to the ground 252. The other end of the resistance R255 is connected to one end of a control voltage terminal 253 and one end of the bypass capacitor C255, and the other end of the bypass capacitor C255 is connected to the ground 251. Moreover, one end of the resistance R252 is connected to a node between the variable capacitor Cv252 and coupling capacitor C252, and the other end of the resistance R252 is connected to the ground 252. Furthermore, one end of the resistance R256 and one end of the variable capacitor Cv256 are connected to a node between the coupling capacitor C252 and inductor L253, and the other end of the variable capacitor Cv256 is connected to the ground 252. The other end of the resistance R256 is connected to the control voltage terminal 253 and one end of the bypass capacitor C256, and the other end of the bypass capacitor C256 is connected to the ground 251. Moreover, one end of the resistance R253 is connected to a node between the variable capacitor Cv253 and coupling capacitor C253, and the other end thereof is connected to the ground 252. Furthermore, one end of the resistance R257 and one end of the variable capacitor Cv257 are connected to a node between the coupling capacitor C253 and inductor L254, and the other end of the variable capacitor Cv257 is connected to the ground 252. The other end of the resistance R257 is connected to the control voltage terminal 253 and one end of the bypass capacitor C257, and the other end of the bypass capacitor C257 is connected to the ground 251. Moreover, one end of the resistance R254 is connected to a node between the variable capacitor Cv254 and coupling capacitor C254, and the other end thereof is connected to the ground 252.

A pair of the inductor L251 and variable capacitor Cv251, a pair of the inductor L252 and variable capacitor Cv252, a pair of the inductor L253 and variable capacitor Cv253, a pair of the inductor L254 and variable capacitor Cv254 each make up a reactance unit. Moreover, the variable capacitors Cv255 through Cv257 each make up a susceptance unit. One reactance unit is serially connected with one susceptance unit.

Note that the bypass capacitors C255 through C257 and resistances R255 through R257 are devices for applying control voltage to the variable capacitors Cv251 through Cv257. On the other hand, the coupling capacitors C251 through C254 are capacitors for cutting off the direct-current components of control voltage applied to the variable capacitors Cv251 through Cv257.

The variable capacitors Cv251 and Cv254 are the same variable capacitance device, and the variable range of capacitance thereof (hereafter, this is represented as C1 in the present embodiment) is also the same. In the same way, the variable capacitors Cv252 and Cv253 are the same variable capacitance device, and the variable range of capacitance thereof (hereafter, this is represented as C2 in the present embodiment) is also the same. The variable capacitors Cv255 through Cv257 are the same variable capacitance device, and the variable range of capacitance thereof (hereafter, this is represented as Cv in the present embodiment) is also the same.

As shown in FIG. 26, the control signal (control voltage) of the phase shifter 250 is input from the control voltage terminal 253 alone. More specifically, the control signal input from the control voltage terminal 253 is transmitted to the variable capacitors Cv251 through Cv257. That is, with the present embodiment, an arrangement has been made wherein a common control signal is used as for all the variable capacitance devices, in the same way as the second embodiment. Thus, an unshown control unit needs to generate only one type of control signal, thereby facilitating the configuration of the control unit.

The capacitance of the variable capacitance devices in the phase shifter 250 according to the present embodiment is determined by the same concept as with the phase shifter 120 according to the second embodiment. That is to say, $C1 = k \cdot Cv$ [pF], and $C2 = 0.5 \cdot k \cdot Cv$ [pF], wherein k is a constant. Accordingly, the capacity ratio thereof is C1:C2:Cv=k:0.5k:1.

This capacity ratio may be realized using the area ratio of a variable capacitor for example, in FIG. 25, the area of each variable capacitor is indicated with a dotted-line frame, which represents that the above capacity ratio has been realized with the area ratio of the variable capacitor, though not strictly.

While description has been made regarding the embodiments of the present invention, the present invention is not restricted to these. For example, the circuit diagrams described above are examples, the same functions can be realized using equivalent circuits of the circuits described in each embodiment. Moreover, in a case that the usage conditions of the phase shifter change, the number of unit elements made up of a reactance unit and a susceptance unit or circuit constants may be changed. Furthermore, the realization of the capacity ratio of a variable capacitor described in the second, fourth, and fifth embodiments is not restricted to the method using the area ratio of a variable capacitor, rather, other methods may be employed instead. Moreover, the mounting examples described in the fourth and fifth embodiments are only examples, and accordingly other arrangements may be made instead. Furthermore, the control unit may control the first variable capacitance device and the second variable capacitance device simultaneously.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A phase shifter comprising:
   (i) a plurality of phase shift units serially connected, each comprising
   a reactance unit including a first variable capacitance device, wherein the reactance unit is connected to an adjacent reactance unit, and
   a susceptance unit including a second variable capacitance device, connected to said reactance unit, wherein the reactance unit, the adjacent reactance unit, and the susceptance unit form a T-section, and wherein the first variable capacitance device and the second variable capacitance device have a capacity ratio such that the first variable capacitance device and the second variable capacitance device are controllable by a common control signal; and
   (ii) a control unit for outputting the common control signal to said phase shift units,
   wherein said control unit outputs the control signal so as to maintain the following expression constant:

$$Z_0 = \sqrt{\frac{X}{B}}$$

wherein $Z_0$ represents characteristic impedance, X represents reactance for said reactance unit, and B represents susceptance for said susceptance unit.

2. The phase shifter according to claim 1, wherein said control unit controls said first variable capacitance device and said second variable capacitance device simultaneously.

3. A phase shifter comprising:
   (i) a phase shift unit comprising
   a reactance unit including a first variable capacitance device, and
   a susceptance unit including a second variable capacitance device, connected to said reactance unit; and
   (ii) a control unit for outputting a common control signal to said phase shift unit,
   wherein said first variable capacitance device and said second variable capacitance device are made up with a predetermined capacity ratio such that said first variable capacitance device and said second variable capacitance device are controllable by the common control signal,
   wherein the control signal is such that the following expression constant is maintained:

$$Z_0 = \sqrt{\frac{X}{B}}$$

wherein $Z_0$ represents characteristic impedance, X represents reactance for said reactance unit, and B represents susceptance for said susceptance unit.

4. The phase shifter according to claim 3, wherein said predetermined capacity ratio is determined by the area ratio of said first variable capacitance device and said second variable capacitance device.

5. A phase shifter comprising:

(i) a plurality of phase shift units serially connected, each comprising:

a reactance unit including a first variable capacitance device and a fixed inductance device, wherein the reactance unit is connected to an adjacent reactance unit, and a susceptance unit including a second variable capacitance device, connected to said reactance unit, wherein the reactance unit, the adjacent reactance unit, and the susceptance unit form a T-section, and wherein the first variable capacitance device and the second variable capacitance device have a capacity ratio such that the first variable capacitance device and the second variable capacitance device are controllable by a common control signal; and (ii) a control unit for outputting the common control signal to said phase shift units, wherein the control signal is such that the following expression constant is maintained:

$$\theta = \tan^{-1} - \frac{B - 2X + BX^2}{2(1 - BX)}.$$

wherein $Z_0$ represents characteristic impedance, X represents reactance for said reactance units, and B represents susceptance for said susceptance units.

6. The phase shifter according to claim 5, wherein $X = j\omega L + 1/j\omega C$ $B = \omega C v$ wherein L is the inductance of the fixed inductance devices, C is the capacitance of the first variable capacitance devices, Cv is the capacitance of the second variable capacitance devices, and $\omega$ denotes an angle frequency.

7. The phase shifter according to claim 5, wherein the control unit sends the control signal to change an amount of phase shift, $\theta$, continuously:

$$\theta = \tan^{-1} - \frac{B - 2X + BX^2}{2(1 - BX)}.$$

8. The phase shifter according to claim 5, wherein said control unit controls said first variable capacitance devices and said second variable capacitance devices simultaneously.

9. The phase shifter according to claim 5, which is connected to an attenuator and a signal synthesizing unit.

10. An array antenna block comprising multiple antennas, each comprising:

a receiving unit for receiving a signal;

an attenuator at which the signal is attenuated; and the phase shifter of claim 5 for receiving the attenuated signal and outputting a phase-shifted signal to a signal synthesizing unit.

11. The array antenna block according to claim 10, which is formed on a semiconductor substrate.

* * * * *

UNITED STATES PATENT AND TRADEMARK OFFICE
CERTIFICATE OF CORRECTION

PATENT NO. : 7,126,442 B2  
APPLICATION NO. : 10/884445  
DATED : October 24, 2006  
INVENTOR(S) : Kunihiko Nakajima, Kenichi Ohta and Yoshiki Iwazaki It is certified that error appears in the above-identified patent and that said Letters Patent is hereby corrected as shown below:

On the title page, column 2, Foreign Patent Documents, delete "7-99424" and insert --7-99425--, therefore.

Column 33, line 7, in claim 5, delete "comprising:" and insert --comprising--, therefore.

Column 33, line 27-30, in claim 5, delete

" $\theta = \tan^{-1} - \dfrac{B - 2X + BX^2}{2(1 - BX)}$ " and insert

-- $Z_0 = \sqrt{\dfrac{X}{B}}$ --, therefore

Signed and Sealed this

Fourteenth Day of August, 2007

JON W. DUDAS  
*Director of the United States Patent and Trademark Office*